United States Patent [19]
Verdiell et al.

[11] Patent Number: 5,870,417
[45] Date of Patent: Feb. 9, 1999

[54] THERMAL COMPENSATORS FOR WAVEGUIDE DBR LASER SOURCES

[75] Inventors: Jean-Marc Verdiell, Palo Alto; Robert J. Lang, Pleasanton, both of Calif.; Thomas L. Koch, Holmdel, N.Y.; Mehrdad Ziari, Fremont, Calif.

[73] Assignee: SDL, Inc., San Jose, Calif.

[21] Appl. No.: 822,467

[22] Filed: Mar. 21, 1997

Related U.S. Application Data

[60] Provisional application No. 60/033,4442, Dec. 20, 1996, and provisional application No. 60/033,892, Dec. 20, 1996, and provisional application No. 60/038,832, Feb. 6, 1997.

[51] Int. Cl.[6] ................................................ H01S 3/10
[52] U.S. Cl. .......................... 372/32; 372/20; 372/92; 372/96; 372/102
[58] Field of Search .............................. 372/6, 26, 46, 372/50, 92, 96, 102, 34, 20, 32

[56] References Cited

U.S. PATENT DOCUMENTS

| | | | |
|---|---|---|---|
| 4,786,132 | 11/1988 | Gordon | 385/38 |
| 5,317,576 | 5/1994 | Leonberger et al. | 372/6 |
| 5,666,372 | 9/1997 | Ball et al. | 372/6 |
| 5,668,821 | 9/1997 | Hodgson | 372/6 |
| 5,682,398 | 10/1997 | Gupta | 372/22 |
| 5,699,377 | 12/1997 | Pan | 372/92 |
| 5,715,263 | 2/1998 | Ventrudo et al. | 372/6 |

OTHER PUBLICATIONS

R. J. Campbell et al., "Wavelength Stable Uncooled Fibre Grating Semiconductor laser For Use in an All Optical WDM Access Network", Electronic Letters, vol. 32(2), pp. 119–120 (Jan. 18, 1996).

P. A. Morton et al., "Stable Single Mode Hybrid Laser With High Power and Narrow Linewidth", Applied Physics Letters, vol. 64(20) , pp. 2634–2636, May 14, 1994.

Ching–Fuh Lin et al., "Superluminescent Diodes with Bent Waveguides", IEEE Photonics Technology Letters, vol. 8(2), pp. 206–208, Feb. 1966.

Melles Griot, "Temperature Compensation for Fiber Bragg Gratings Increase Stability", *Fiberoptic Product News*,pp. 44, 45 & 48, Jun. 1966.

G. W. Yoffe, et al., "Passive Temperature Compensationg Package for Optical Fiber Gratings", *Applied Optics*,pp. 6859–6861, Oct. 20, 1995.

*Primary Examiner*—James W. Davie
*Attorney, Agent, or Firm*—W. Douglas Carothers, Jr.

[57] ABSTRACT

A waveguide DBR laser or waveguide DBR laser array may be comprised of a semiconductor gain element, or a series of semiconductor gain elements, in combination with a waveguide grating functioning as a resonant cavity end reflector for lasing operation comprising either an optical fiber having a fiber grating (fiber DBR laser) or a planar waveguide (planar waveguide DBR laser). The gain element may be comprised of a laser diode which has high efficient AR coating on its front facet so that it functions as a modulated gain element in a resonant cavity established between its rear HR facet and the grating formed in the external waveguide. Disclosed are ways to form this resonant cavity so that gain element modulation rates can be carried out in excess of 2 Gb/sec with suppression of longitudinal mode hops and/or with trimming to compensate for wavelength changes, rendering the waveguide DBR laser or waveguide DBR laser array highly suitable for WDM transmitter, dense WDM transmission systems and other communications applications.

111 Claims, 9 Drawing Sheets

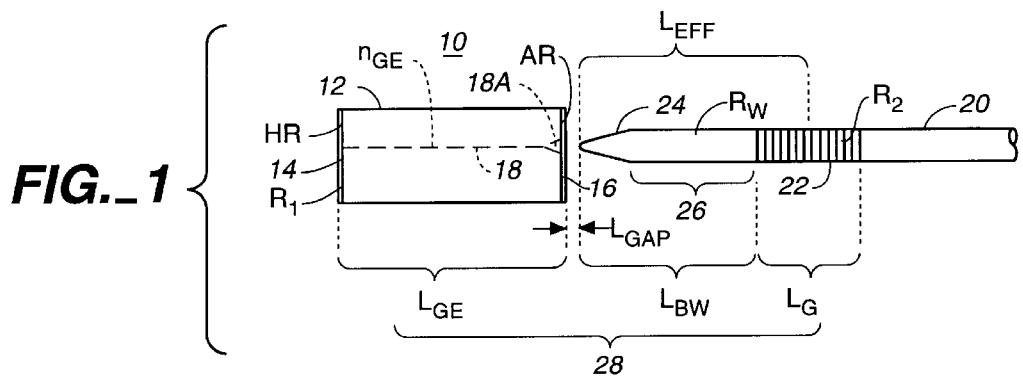
FIG._1
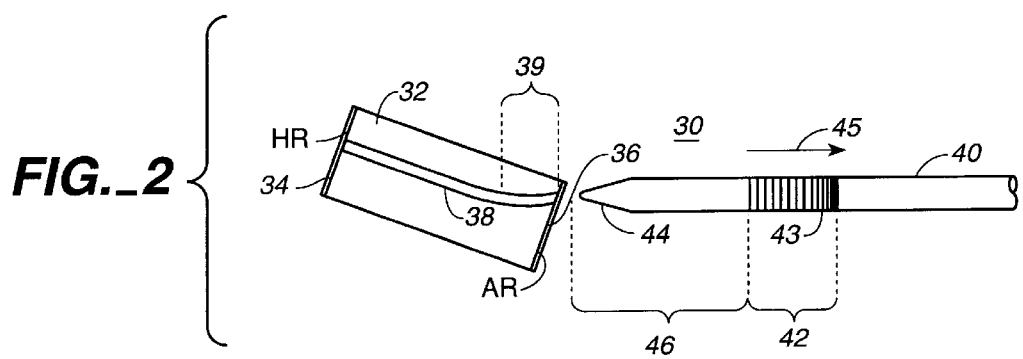
FIG._2
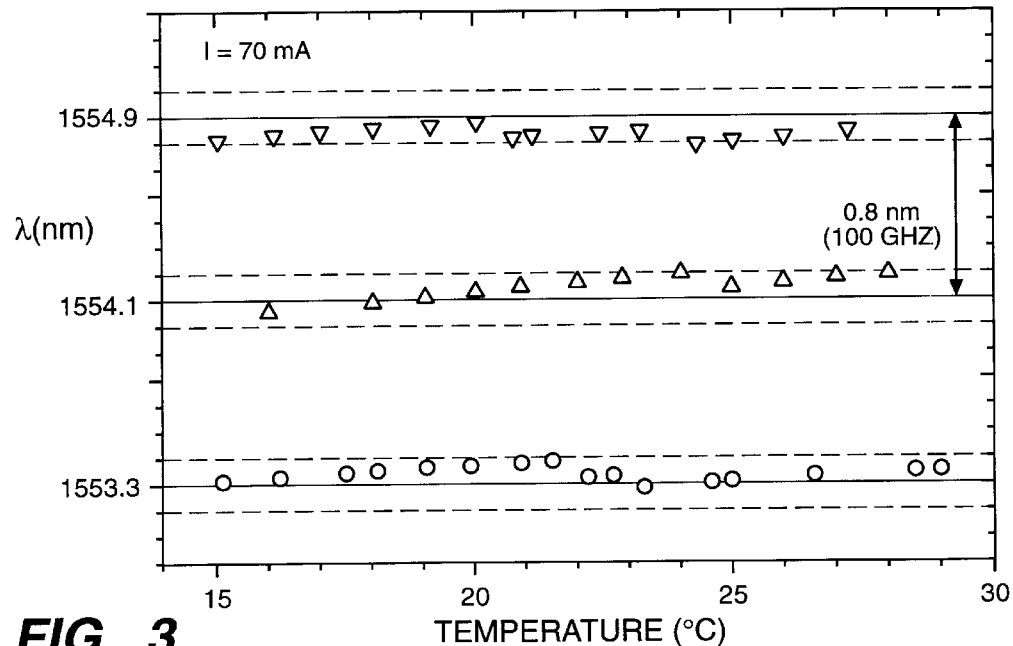
FIG._3

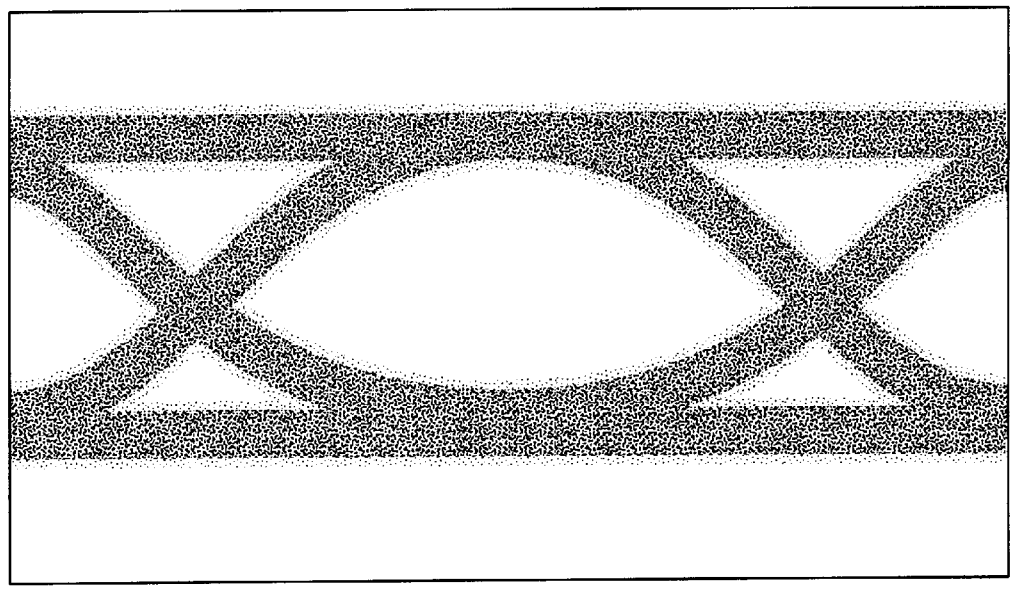
FIG._4
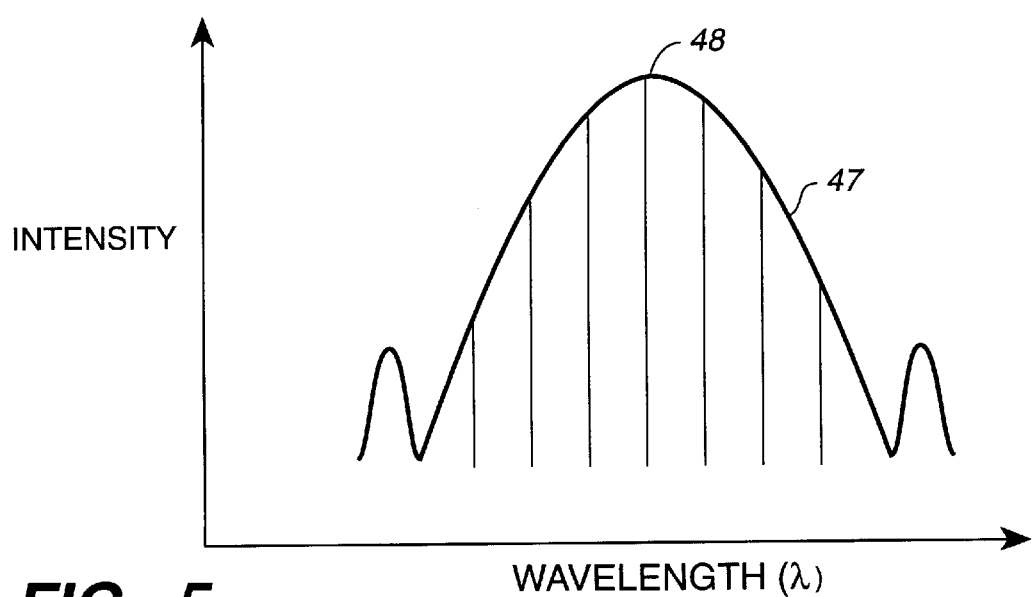
FIG._5

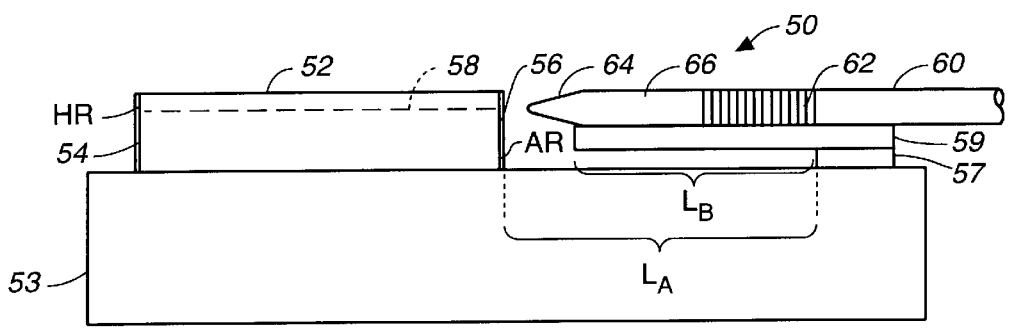
FIG._6
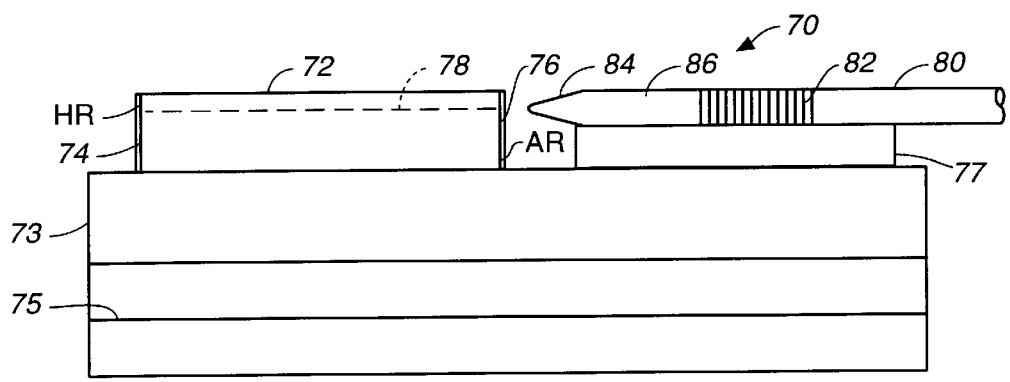
FIG._7
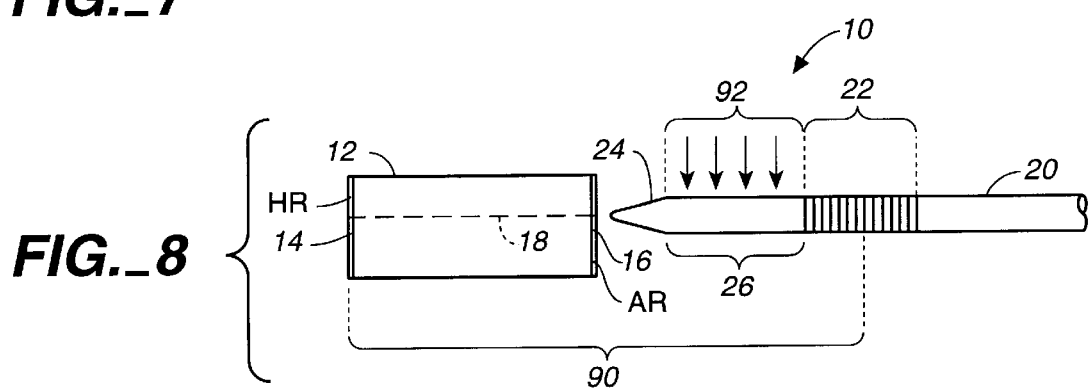
FIG._8
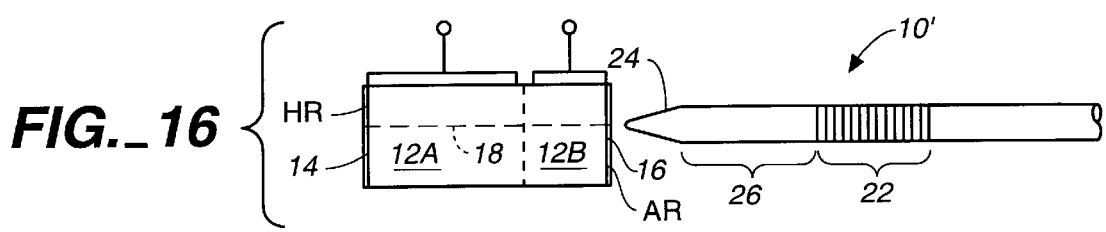
FIG._16

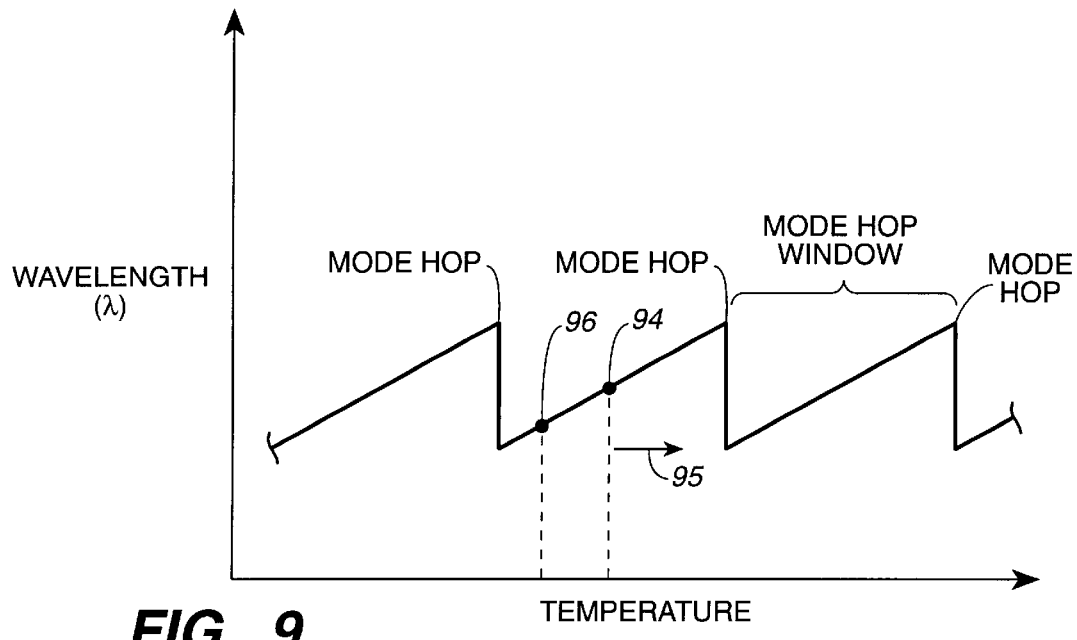
FIG._9
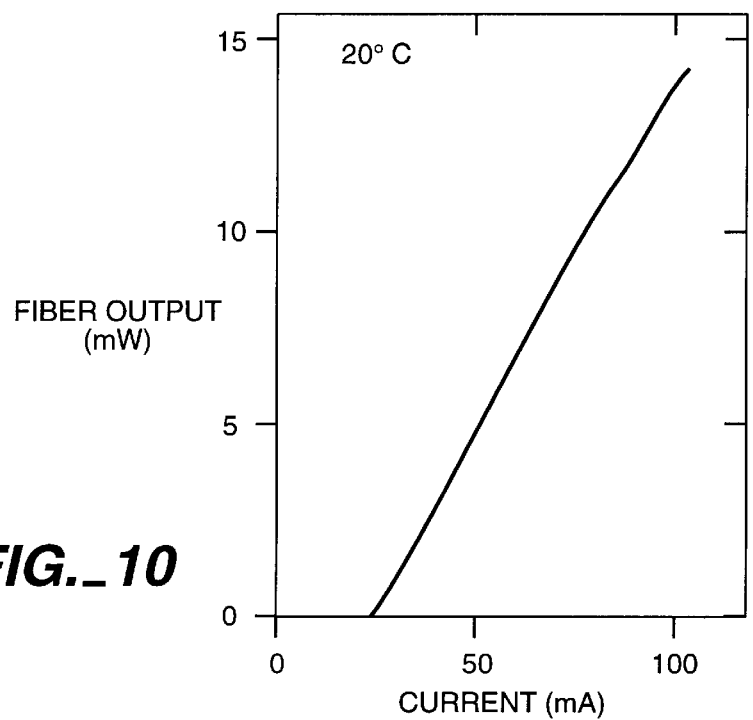
FIG._10

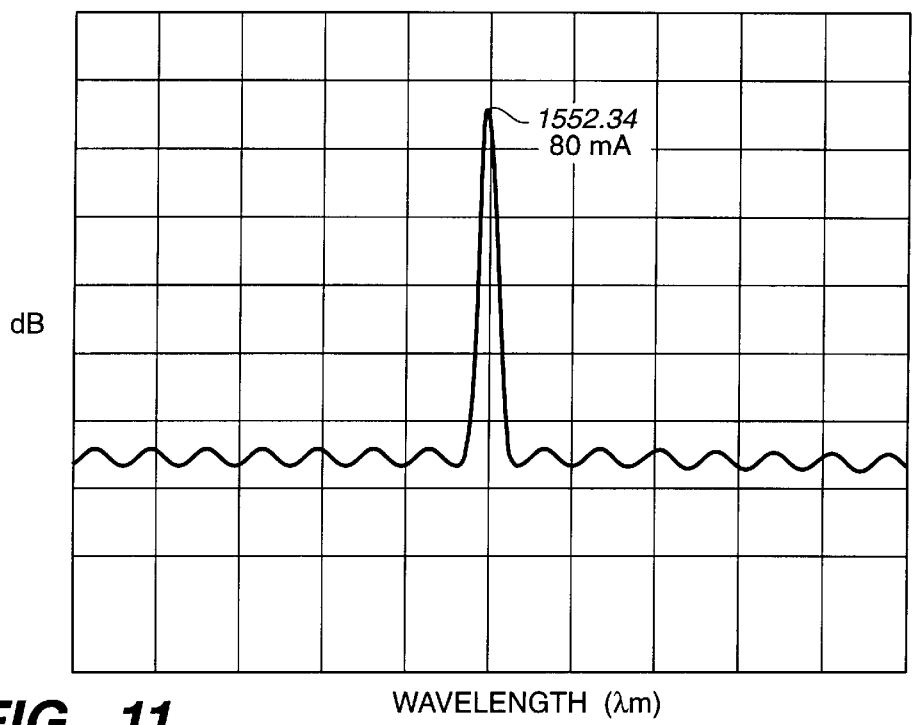
FIG._11
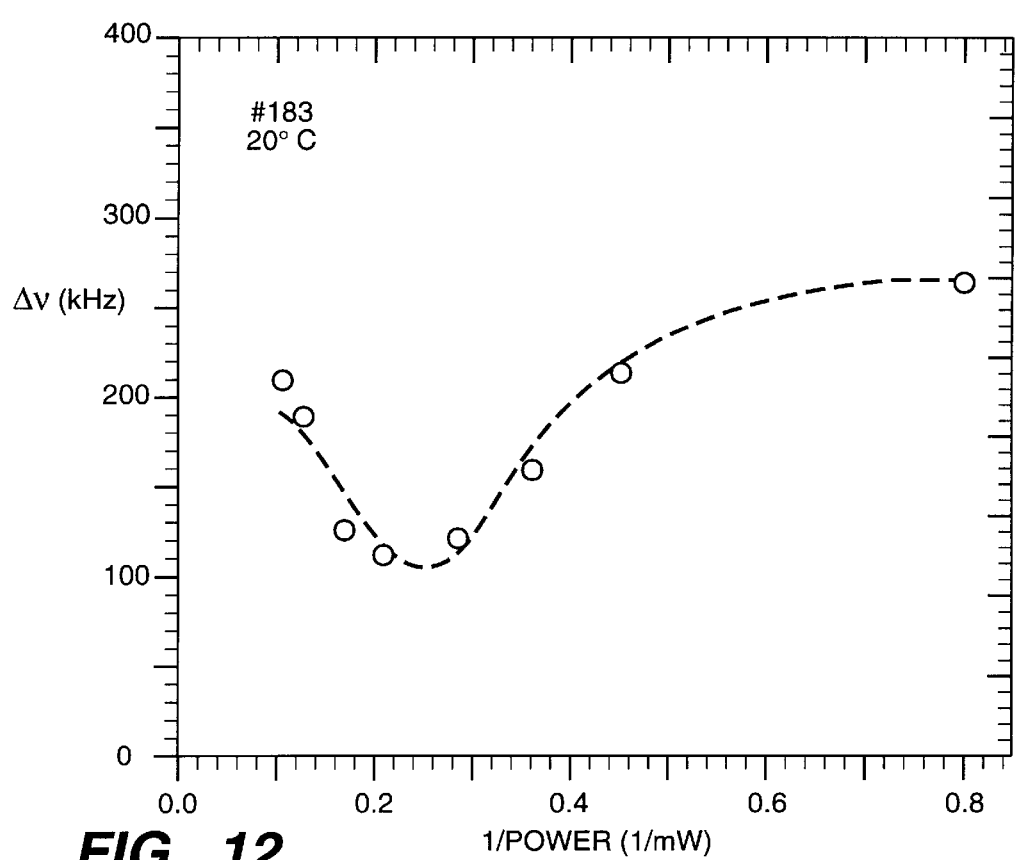
FIG._12

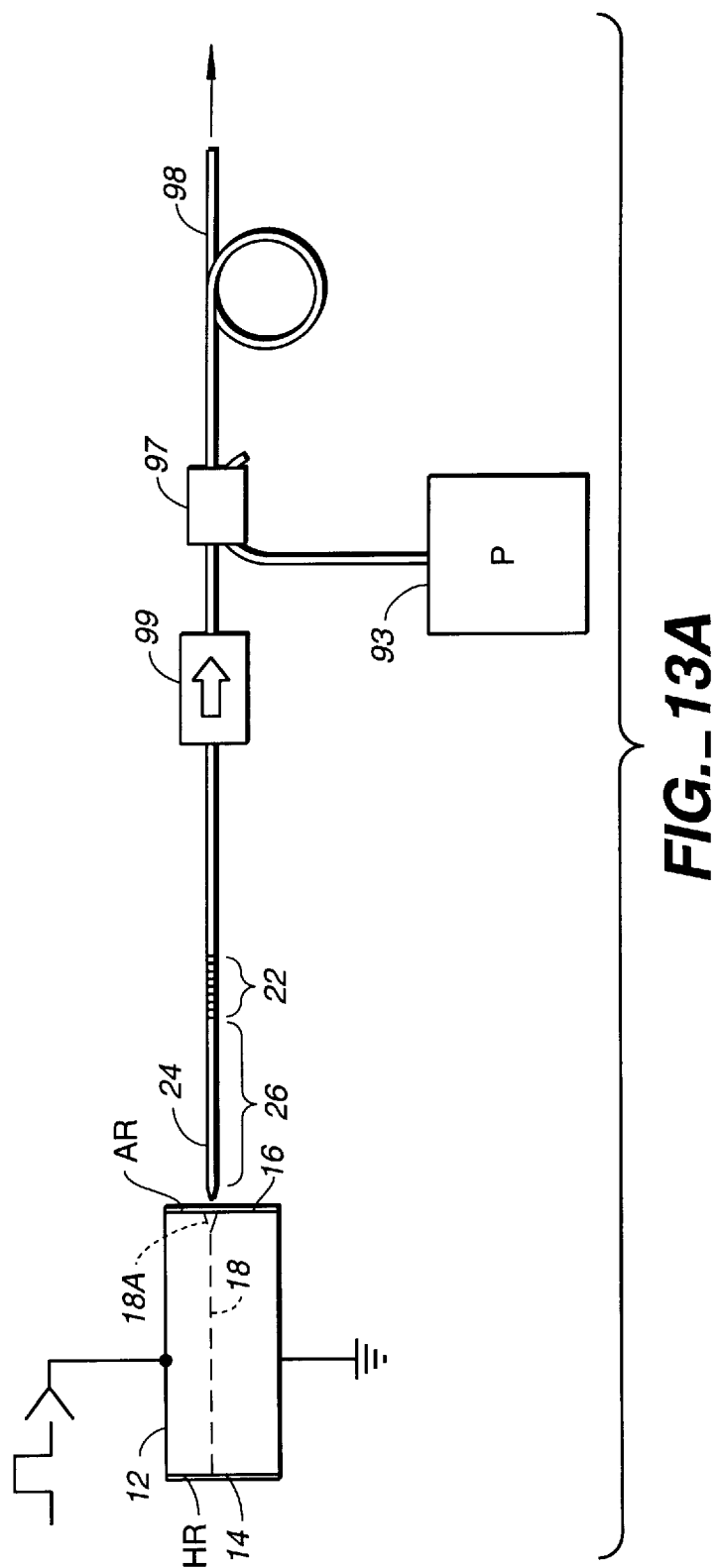
FIG._13A

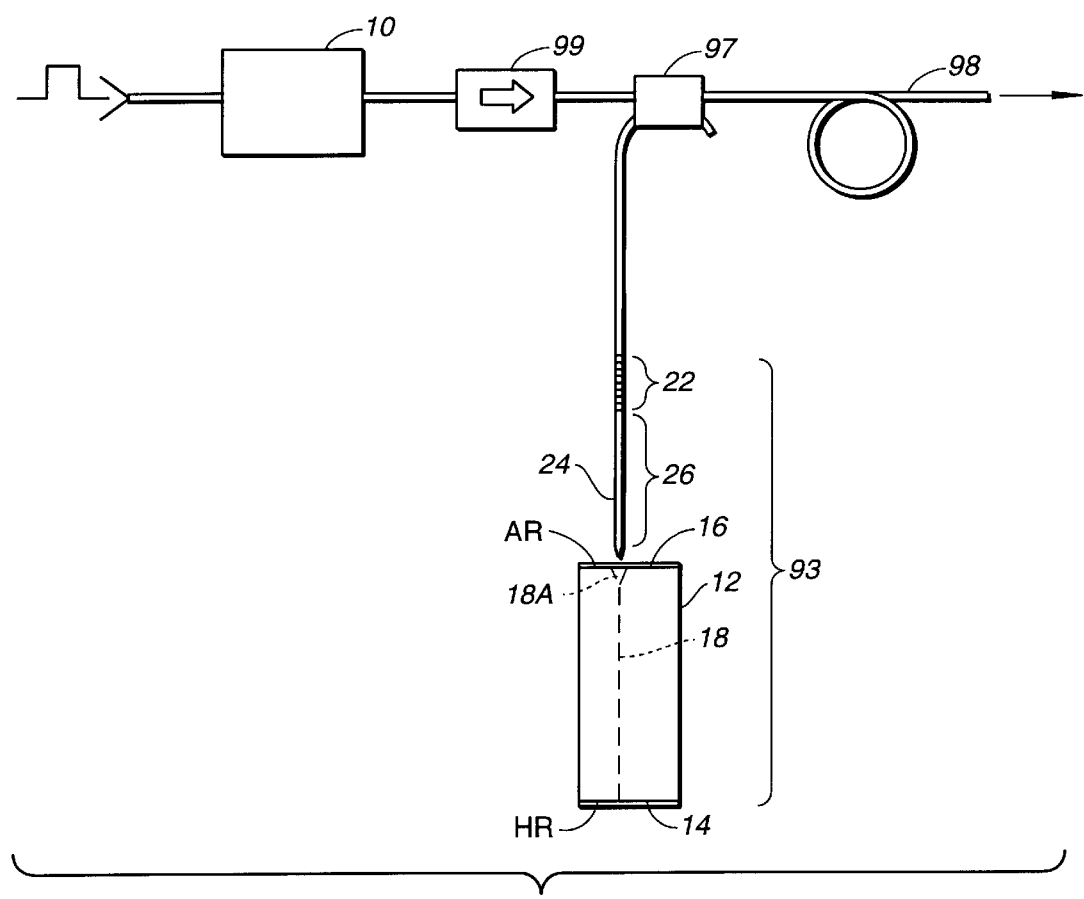
FIG._13B

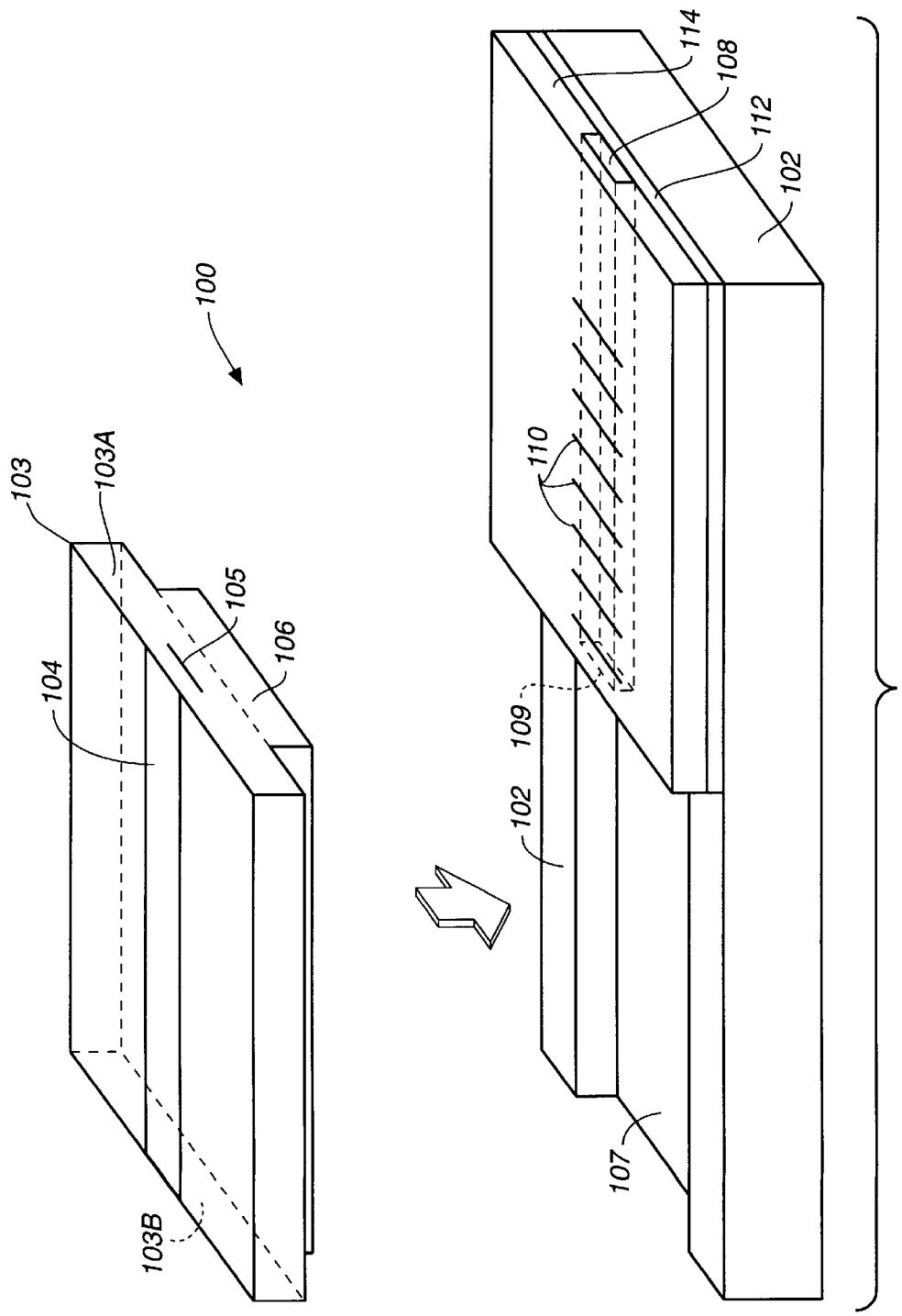

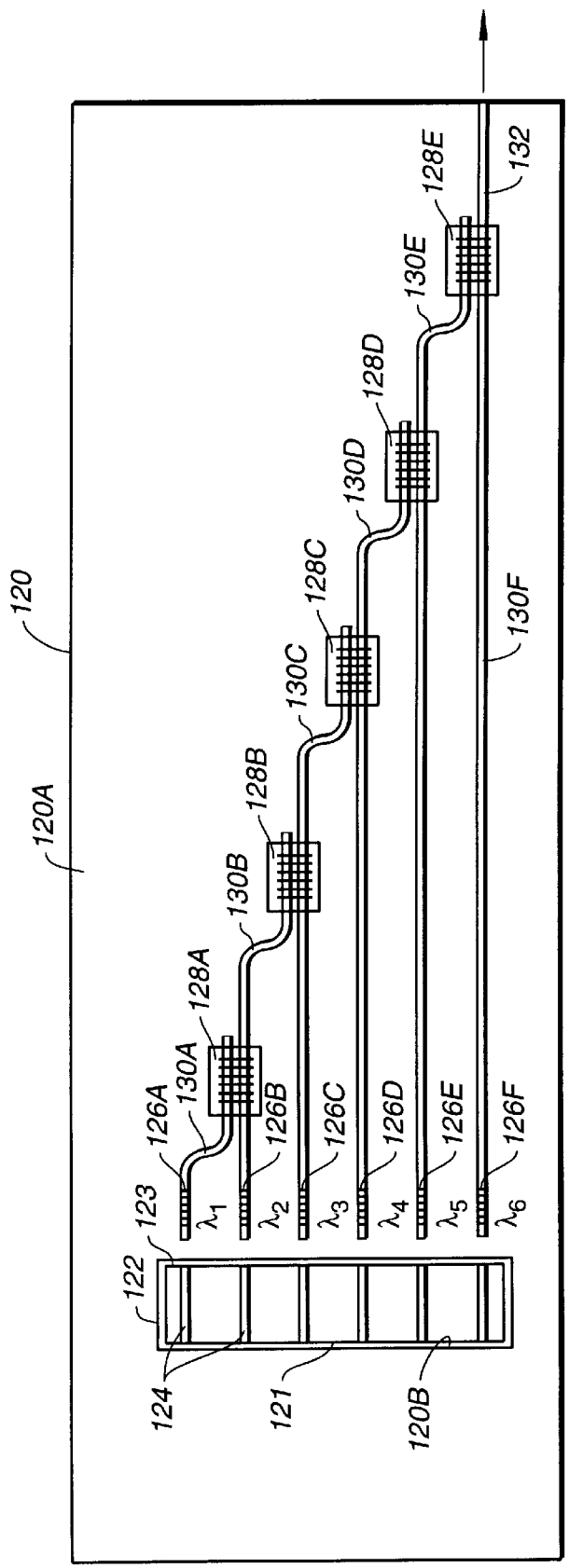
FIG._15

THERMAL COMPENSATORS FOR WAVEGUIDE DBR LASER SOURCES

CROSS-REFERENCE TO RELATED APPLICATIONS

This is a continuation of provisional application Ser. No. 60/033,442, filed Dec. 20, 1996, entitled, "FIBER DBR DISCLOSURE/PATENT SUMMARY"; Ser. No. 60/033,892, filed Dec. 20, 1996, entitled, "LOW-COST WDM TRANSMITTER USING A WAVEGUIDE DBR ARRAY"; and Ser. No. 60/038,832, filed Feb. 6, 1997, entitled, "HIGH SPEED WAVEGUIDE GRATING COUPLED DBR LASER DEVICES", all of which are incorporated herein by their reference.

FIELD OF THE INVENTION

This invention relates to laser devices that have stabilized wavelength operation and suppression of longitudinal mode hopping and more particularly to laser devices employing a semiconductor gain medium optically coupled to an external cavity in the form of an optical waveguide including a Bragg reflector, such as an optical fiber or a planar silica waveguide with a Bragg grating, forming an optical resonant cavity of stabilized wavelength operation, which we refer to as waveguide distributed feedback reflector lasers or waveguide DBR lasers or fiber DBR lasers.

BACKGROUND OF THE INVENTION

Wavelength division multiplexing (WDM) imposes new demands on laser sources employed in conjunction with optical fiber and free-space communications. One of these primary demands is the requirement for precision alignment of the source wavelength to one of the prescribed channels of a WDM system. Presently, distributed feedback (DFB) laser diodes are employed in such systems. Since the emission wavelength of a standard DFB laser diode varies with temperature at a typical rate of about 0.1 nm/°C., their deployment in a WDM system requires precision control of the laser temperature, typically to better than ±0.1° C. In order to provide laser sources that operate around room temperature within a tight wavelength tolerance, these types of lasers have to be individually sorted. In addition, screening of DFB laser sources is required to sort out those with low wavelength drift with aging.

WDM systems can be designed to run "open loop" where the channel alignment relies on the long term stability of the DFB wavelength with aging at constant temperature, or the laser emission wavelength can be controlled by an external passive reference filter. This is typically accomplished by monitoring the wavelength-dependent transmission of the filter, employing the laser temperature as a controlling parameter to match the laser output wavelength to the center wavelength of the filter. While such a feedback provides compensation and correction there are added costs to bear such as the external reference filter and required servo circuit controls in the feedback system.

A more simple approach is the use of a passive wavelength selection element in an optical fiber waveguide or a silica waveguide with a narrow band Bragg reflector embedded in an optical waveguide functioning as a wavelength filter. The optical waveguide is optically coupled to the laser chip output to provide optical feedback in an extended laser resonator that includes the laser chip rear facet at one end and the external reflector at the other end of the resonant cavity. The narrow band reflector locks the laser wavelength at the Bragg frequency of the fiber Bragg reflector and eliminates the need for additional external filters or servo circuits. Furthermore, the lower temperature sensitivity of the waveguide Bragg reflector center wavelength places tighter bounds on the overall wavelength drift with temperature compared to semiconductor DFB and DBR laser sources. An additional advantage is the ability to modulate the laser with low chirp in the extended, hybrid laser resonator. By directly modulating the current of the gain element, one can generate analog or digital data streams suitable for high speed optical data communication. In addition, by directly modulating the gain element of the waveguide DBR laser source, a train of stable pulses can be produced with tens of picoseconds pulse width having several to tens of milliwatts of peak power.

An antireflection (AR) coated semiconductor laser is thus employed as a gain element providing laser action through amplified stimulated emission while the optical fiber and the waveguide Bragg reflector function as the principal part of the optical cavity with very low loss.

Perhaps one of the largest concerns in the use of such hybrid extended laser cavities with a waveguide Bragg grating is the stability of longitudinal mode selection in operation of the laser source. The ability to produce waveguide DBR lasers with tightly controlled operating wavelengths is important for WDM systems, particularly dense WDM systems requiring closely spaced fixed wavelengths. However, the waveguide DBR by itself will not be stable in single longitudinal mode operation because longitudinal mode transition can occur with changes in environmental temperature or current pumping. A primary source of this instability stems from the difference in the dependence of refractive index in the different components making up the resonant cavity. What is needed is some way of stabilizing the waveguide DBR taking into consideration these foregoing mentioned factors of temperature changes and refractive index differences.

An object of this invention is to provide a stabilized waveguide DBR laser source.

Another object of this invention is to provide a directly modulated waveguide DBR laser capable of operating at high modulation rates in excess of 2.0 Gb/s.

It is another object of this invention to provide a waveguide DBR laser that can be assembled to ensure reliable operation with aging and environmental temperature changes.

SUMMARY OF THE INVENTION

According to this invention, a waveguide DBR laser or waveguide DBR laser array are comprised of a single, or a set of parallel semiconductor gain elements in combination with either an optical fiber having a fiber grating or a planar waveguide having a waveguide grating, parallel sets of these, functioning as a resonant cavity end reflector for lasing operation. The gain element may be comprised of a laser diode which has a highly efficient AR coating on its front facet so that it functions as a modulated gain element in a resonant cavity established between is rear HR facet and the grating formed in the external grating. This invention provides criteria for designing waveguide DBR laser or waveguide DBR laser arrays to achieve high speed modulation rates, such as in excess of 200 Mb/s, preferably in excess of 2.0 Gb/s, and, further, provides approaches for eliminating, reducing or otherwise avoiding the effects of longitudinal mode hopping of the waveguide DBR laser or waveguide DBR laser array output, rendering the waveguide DBR device highly suitable for WDM communications applications.

As used in this application, the term "waveguide", such as, for example, as used in "waveguide DBR laser", is reference to a class of light waveguides that comprises both (1) optical fibers (fiber waveguides) having circular, elliptical, rectangular or other polygonal cross-sectional core/cladding configurations, as known in the art, and (2) planar waveguides having channel or buried light waveguides made of material capable of waveguiding light, such as those comprised of silica.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 1 is a schematic side view of a waveguide DBR laser of a first type comprising this invention utilizing a fiber waveguide having a grating reflector.

FIG. 2 is a schematic plan view of another waveguide DBR laser of the type comprising this invention.

FIG. 3 is a graphic illustration of wavelength output three different waveguide DBR lasers over an extended temperature range with a wavelength separation of about 100 GHz.

FIG. 4 is an eye diagram for one of the grating coupled DBR lasers of FIG. 3 at a modulated data rate of 2.48 Gb/s.

FIG. 5 is a graphic illustration of the typical alignment of longitudinal modes in the output of a laser.

FIG. 6 is a schematic side view of a waveguide DBR laser of this invention temperature compensated for changes in optical resonant cavity length.

FIG. 7 is a schematic side view of a further waveguide DBR laser of this invention temperature compensated for changes in optical resonant cavity length.

FIG. 8 is a schematic side view of a waveguide DBR laser of this invention refractive index compensated for changes in optical resonant cavity length.

FIG. 9 is a graphic illustration of the typical longitudinal mode behavior of a fiber DBR laser with changes in temperature.

FIG. 10 is an output power versus current curve of a waveguide DBR laser comprising this invention.

FIG. 11 is the wavelength spectrum of a waveguide DBR laser comprising this invention.

FIG. 12 is the linewidth spectrum for a waveguide DBR laser comprising this invention.

FIGS. 13A and 13B are illustrations of applications of a fiber DBR laser comprising this invention.

FIG. 14 is a schematic perspective view of a waveguide DBR laser of a second type comprising this invention utilizing a planar waveguide having a grating reflector.

FIG. 15 is a schematic plan view of a waveguide DBR laser array according to another embodiment of this invention.

FIG. 16 is a schematic side view of a waveguide DBR laser of a first type shown in FIG. 1 with a gain element that includes a phase section.

DETAILED DESCRIPTION OF THE PREFERRED EMBODIMENTS OF THE INVENTION

We begin with a discussion and analysis of a waveguide DBR laser source 10 such as shown in FIG. 1. Grating waveguide DBR laser source 10 comprises a laser diode 12, such as a InGaAs/GaAs or InGaAsP/InP diode having an active region 18 comprising a strained or unstrained multiple quantum well structure. Rear facet 14 of the diode is of high reflectivity (HR) while the front or exit facet 16 is anti-reflection (AR) coated so that the unwanted Fabry-Perot modes of the diode chip itself are significantly reduced if not eliminated. The diode then operates like a gain element, i.e., diode 12 is not a functioning laser since its exit facet 16 is antireflection coated and there is no resonant feedback. Instead, it functions simply as gain medium when pumped providing amplification of light generated in diode 12 or light that enters through the AR coated facet 16. Internal reflection from AR exit facet 16 is less than 1%, which is sufficiently low to suppress self oscillation of gain element 12 in the absence of an external resonant cavity. The length of gain element 12 is generally around 250 $\mu$m, as will be seen with respect to the teachings of this invention, may be preferably shorter than 250 $\mu$m for a shorter cavity length to substantially reduce mode hopping and to achieve higher rates of modulation, not previously achieved, as will be evident from later analysis.

Light emission from exit facet 16 is coupled into an optical waveguide 20, here shown as an optical fiber, which is generally a single mode fiber, but depending upon the application, may also be a multimode fiber. Optical coupling means 24 between gain element 12 and waveguide 20 is designed to enhance maximum light coupling. Coupling means 24 is shown here in the form of a pencil-end or conical lens. Such a coupling lens may be formed directly on the end of the fiber or spliced to the fiber containing a formed Bragg grating 22. However, other lens configurations are also preferred such as a concaved cylinder shaped lens formed in the fiber in the form of transverse groove and a chisel or wedge shaped lens with parallel planar bevel surfaces extending toward the fiber end terminating in a transverse line or edge. The spacing, $L_{GAP}$, between exit facet 16 and coupling means 24 is usually within the range of about 5 $\mu$m to about 50 $\mu$m achieving a coupling efficiency in the range of about 50% to 80%. If spacing, $L_{GAP}$, is greater than this range, higher coupling losses become more and more significant. Coupling efficiency of the light emission from gain element 12 can be enhanced by utilizing a mode transformer 18A at the exit facet to enlarge or mode match the semiconductor waveguide mode with the fiber mode. Mode transformer 18A may be two dimensional, i.e., it may widen the waveguide mode dimension both laterally (horizontally) and transversely (vertically) at the forward end of active region 18, such as for a distance of 50 $\mu$m to 200 $\mu$m. Mode transformer 18A renders initial alignment between gain element 12 and fiber 20 easier to accomplish as well as providing continued relaxed alignment tolerances with fixture aging thereby extending the useful lifetime of source 10.

A Bragg grating 22 is formed in waveguide 20 by conventional means, such as selective UV light exposure with an excimer laser, forming a periodic grating of systematic refractive index change in the waveguide core. Grating 22 is positioned in close proximity to the end of fiber 20, i.e., within one or several mm, and may even be positioned at the point of lens 24. Grating 22 may also be chirped to help prevent longitudinal mode hopping and allow extended phase locking. Grating 22 may also be apodized to eliminate side lobes in the reflection spectrum as well as operation in multiple lasing cavities. Since exit facet 16 is AR coated, the effective lasing or resonant cavity of source 10 is between rear HR facet 14 of gain element 10 and fiber grating 22 as represented by bracket 28 in FIG. 1. Thus, source 10 is referred to as a fiber DBR light source since the resonant cavity includes a modulated gain element 12 in combination with an additional cavity in the form of fiber 26 and grating 22, indicated in FIG. 1 as the effective length, $L_{EFF}$.

Reference is now made to FIG. 2 to illustrate other features that may be individually or selectively combined or incorporated into source 10. Waveguide source 30 comprises gain element 32 having a pump stripe 38 that has a portion that is either curved or angled to exit facet 36 in order to prevent optical feedback into the optical cavity of gain element 32. Undesired reflections are caused from exit facet 36 where optical fiber 40 is butt coupled to element 32. These spurious reflections cause optical power jumps and large wavelength mode hops as much as 0.6 nm which is undesirable in utilizing multiple sources in dense WDM applications. The exit facet reflectivity is reduced by angling a portion 39 of pump stripe relative to exit facet 36, such as within the range of about 5° to about 15° from the exit facet normal, so that any light reflected from exit facet 36 is not coupled back into the optical cavity of gain element 32 as represented by pumping stripe 38. Mode transformer 18A of FIG. 1 may also be included at exit facet 36 to permit expansion and matching of the semiconductor mode with the fiber mode. Exit facet cavity reflectivities can be reduced to values as low as $5 \times 10^{-5}$ employing angled pump stripe 39. As reported in the article of R. J. Campbell et al. entitled, "Wavelength Stable Uncooled Fibre Grating Semiconductor laser For Use in an All Optical WDM Access Network", *ELECTRONIC LETTERS*, Vol. 32(2), pp. 119–120 (Jan. 18, 1996), a grating provided a peak reflectivity of 24% and a bandwidth of 0.2 nm for a total gain element/fiber resonant cavity length of about 1 cm which corresponded to a free spectral range of 0.05 nm, compared to the case where no angled pump stripe portion was utilized which was about 0.6 nm. This fiber DBR source reportedly maintained single frequency operation over the temperature range of 15° C. to 45° C. except there was still regions of mode hopping. Furthermore, current pumping of the gain element in excess of 95 mA caused multimode operation. It was recognized that laser mode hops cannot be avoided over such a temperature operating range without some kind of temperature control.

Another feature of fiber DBR laser source 30 is the employment of a chirped grating 42 in fiber 40 which helps to suppress longitudinal mode hopping. As in the case of FIG. 1, fiber 40 has a coupling end with optical coupling means 44, a bare waveguide portion 47 and chirped grating 42. If the grating chirp is such that the direction of reduced grating period is in the direction of arrow 45, i.e., the grating period monotonically decreases or becomes smaller away from gain element 32, more stable single longitudinal mode operation can be achieved. In this connection, see the article of P. A. Morton et al., "Stable Single Mode Hybrid Laser With High Power and Narrow Linewidth", *Applied Physics Letters*, Vol. 64(20), pp. 2634–2636, May 14, 1994, incorporated herein by its reference. In particular, see the discussion on page 2635, column 2 beginning at line 10 and to the end of the column.

Moreover, the fiber grating employed may apodized on at least one of its ends if not both ends of the grating to eliminate spectral side lobes. The apodized ends of the grating can be utilized with either a constant period grating or a chirped grating.

A main aspect of this invention is to increase the modulation capability of fiber DBR source 10, as well into the gigabit range. In FIG. 1, the length of gain element 12 is represented by $L_{GE}$, which is typically around 250 $\mu$m as previously indicated, the gap between gain element 12 and the end of waveguide 20 is represented by $L_{GAP}$, the length of the bare portion of the waveguide or fiber 20 (portion 26) is represented by $L_{BW}$, the length of the grating is represented by $L_G$, and the effective length of waveguide 20 is represented by $L_{EFF}$. Due to the comparatively very short length of gap, $L_{GAP}$, (less than 50 $\mu$m), this parameter is intentionally neglected in the analysis. The effective length, $L_{EFF}$, is determined from the following equation:

$$L_{EFF} = L_{BW} + \frac{\tanh(\kappa L_G)}{2\kappa} \quad (1)$$

where $\kappa$ is the coupling constant of the waveguide grating, which is on the order of about 0.5 cm$^{-1}$ to about 10 cm$^{-1}$. As an example of the effective length, $L_{EFF}$, typically $\kappa$ is around 1.5 cm$^{-1}$, $L_G$ may be 5 mm to 10 mm, $L_{BW}$ may about 1 mm so that $L_{EFF}$ may be about 3 mm to about 4 mm.

To enhance the modulation capabilities of a laser source, the design has to be such that the relaxation frequency, $V_{DBR}$, is higher than the modulation rate desired for modulated operation. To begin with, relaxation oscillation frequency, $V_{GE}$, of the gain element 12 functioning as a laser diode (i.e., no AR coating 16, which we refer to as case #1) can be related to relaxation oscillation frequency, $V_{DBR}$, of fiber DBR cavity 28 (i.e., there is an AR coating 16, which we refer to as case #2). The ratio of these two relaxation oscillation frequencies is written as follows:

$$\frac{v_{DBR}}{v_{GE}} = \sqrt{\frac{\tau_{GE}}{\tau_{DBR}}} \quad (2)$$

where $\tau_{GE}$ is the photon lifetime of case #1 and $T_{DBR}$ is the photon lifetime of case #2. Since the effective cavity length of a fiber DBR laser source is longer, the photon lifetime, $\tau_{DBR}$, in case #2 is larger than the photon lifetime, $\tau_{GE}$, in case #1. Therefore, the fiber DBR source 10 has a lower operating modulation bandwidth because its relaxation oscillation frequency, $V_{DBR}$, is lower.

Thus, in order to achieve high transmission bit rates, such as 2.5 Gb/s, a cavity design for the waveguide DBR laser is provided such that the relaxation oscillation frequency, $V_{DBR}$, is high enough to enable sufficient modulation bandwidth, such as typically between 2.5 GHz to 5 GHz for a 2.5 Gb/s transmission rate. Thus, having selected the relaxation oscillation frequency, $V_{DBR}$, for the source being designed, the length, $L_{GE}$, of gain element 12 and the effective cavity length, $L_{EFF}$, (ignoring $L_{GAP}$ since it is small) are determined by satisfying the following approximate relationship:

$$\left( \frac{L_{BW} + \frac{\tanh(\kappa L_G)}{2\kappa}}{L_{GE}} \right) < \left[ \left( \frac{v_{GE}}{v_{DBR}} \right)^2 - 1 \right] \frac{n_{GE}}{n_W} \quad (3)$$

where $$\frac{\tanh(\kappa L_G)}{2\kappa}$$

is the effective length of the grating, $L_{BW}$ is the length of optical bare waveguide or fiber between the antireflecting exit facet and the waveguide grating, $L_G$ is the length of the waveguide or fiber grating, $L_{GE}$ is the length of the gain element, $\kappa$ is the coupling constant of the fiber grating, $V_{GE}$ is the relaxation oscillation frequency of the gain element 12, $n_{GE}$ is the group effective refractive index of the gain element 12, and $n_W$ is the effective refractive index of the optical waveguide 20. This relationship is approximate because $L_{GAP}$ is neglected compared to the larger lengths of $L_{GE}$ and $L_{EFF}$, internal losses of gain element 12 are neglected, and the coupling losses between gain element 12 and fiber 20 are neglected. Therefore, similar expressions to that above can be derived with these factors taken into consideration but would be more complex and not necessary if the above approximate relationship (3) is achieved.

An example of the foregoing relationship is as follows. A fiber DBR source 10 is desired that is capable of a modulation rate of 1.5 Gb/s so that $V_{DBR}$ need be at least 2.5 GHz. Gain element 12 has a group effective refractive index, $n_{GE}$, of 4.0 and optical fiber 20 has an effective refractive index, $n_W$, of 1.5. The particular gain element without an AR coating 16 has an $V_{GE}$ equal to 7 GHz. The above relationship then solves to:

$$\left( \frac{L_{BW} + \frac{\tanh(\kappa L_G)}{2\kappa}}{L_{GE}} \right) < 18 \quad (4)$$

If $\kappa$ is 1 cm$^{-1}$, the gain element length, $L_{GE}$, is typical, such as, 250 μm, then effective length can be easily chosen to satisfy the relationship so that the total value obtaining on choosing cavity lengths is less than 18. For example, if LBW is equal to 1 mm and LG is equal to 5 mm, then the left side of the relation is 10.16 (10.16<18) satisfying the criteria for the fiber DBR modulation rate design.

FIG. 4 shows the high speed operation of a source 10 is made possible by minimizing the resonant cavity length according to above explained relationship (3). FIG. 4 shows the eye diagram at high speed operation of 2.48 Gb/sec applicable for low chirp direct modulation applications, such as data communications.

We now analyze the temperature sensitivity of the wavelength operation of fiber DBR source 10. The requirement to stabilize the temperature of WDM light sources, such as DFB semiconductor lasers, has been previously perceived as a problem. In DFB lasers, due to their high tuning rate versus temperature, highly precise temperature control is already required to maintain WDM channel alignment. Temperature control will also generally be required for stable operation of a fiber DBR laser. However, the temperature stabilization needed for a DFB semiconductor laser to maintain WDM channel alignment is replaced by the temperature stabilization of a fiber DBR laser to maintain mode selection, and only channel alignment to the second order. This latter requirement is more forgiving in temperature precision, and, also, is more robust against active semiconductor optical path changes that may result from laser chip aging which gives rise to wavelength drifts in DFB semiconductor lasers.

Temperature variations in operation of fiber DBR lasers change the refractive index of materials that comprise the fiber DBR resonant cavity. Changes in refractive index result in changes in optical path length and resulting in a combined shift of the Fabry-Perot modes and the Bragg reflectivity envelope. These temperature variations result in two different effects: (1) changes in operating wavelength, for example, approximately 0.2 Å/°C., and (2) the occurrence of occasional longitudinal mode hops, as large as approximately 1 Å every few °C.

FIG. 5 illustrates the alignment and the envelope 47 of the longitudinal modes of the resonator for fiber DBR laser source 10 and the reflection peak of grating 22 at 48 which is also the normal lasing mode. The selection of a particular longitudinal mode of operation relies generally on having the highest reflectivity (for lowest lasing threshold) and being stable against fluctuations. Envelope 47 can shift with changes in cavity path length but at lower rates of change compared to mode shifting, for example, 0.1 Å/°C.

It should be understood that the wavelength stability of fiber grating 22 is not solely determined by the grating wavelength shift with temperature. Rather, a temperature increase will induce a shift of the Fabry-Perot modes and also, separately, a shift of the Bragg reflectivity envelope 47 toward longer wavelengths. In practice, however as indicated just above, the Fabry-Perot modes will shift faster with temperature change than the Bragg reflectivity envelope because, the refractive index versus temperature change of the semiconductor gain element 12 is larger than that of the glass fiber 20. At some point, the lasing Fabry-Perot mode becomes too misaligned with respect to the Bragg peak reflectivity 48 and the next mode which is now better centered on peak reflectivity 48 will reach threshold. Thus, a temperature change that shifts the modes relative to the reflection peak 48 by a full free spectral range, $\Delta\lambda_{FSR}$, of the resonant cavity will result in the selection of and operation at another longitudinal mode, termed a mode hop. Hence, the wavelength behavior versus temperature looks like the saw-tooth shown in FIG. 9 with regions, which we refer to as "mode hop windows", of monotonic increase at a given rate, for example, approximately 0.1 Å/°C. to 0.2 Å/°C. separated by periodic mode hops. However, over a large temperature range, the periodic set back in wavelength due to mode hops, as illustrated in FIG. 9, will cause the laser to tune at an average low 0.1 Å/°C. rate of fiber Bragg grating tuning. This is clearly demonstrated in FIG. 3 where three fiber DBR lasers 10 track three standard ITU channels to within ±1 Å over a temperature range of about 15° C. to about 30° C.

The distance between mode hops in terms of temperature, moving in one direction, is approximated by the following equation (ignoring again the small gap distance, $L_{GAP}$):

$$\Delta T_{MODE-HOP} = \frac{\Delta\lambda_{FSR}}{\left( \left[ \frac{\Delta\lambda}{\Delta T} \right]_{GE} - \left[ \frac{\Delta\lambda}{\Delta T} \right]_W \right)} \quad (5)$$

Here, the value, $$\left[ \frac{\Delta\lambda}{\Delta T} \right],$$

is the thermal wavelength tuning rate of the particular waveguide component, i.e., the gain element (GE) or the optical waveguide (W), with respect to temperature, T, and $\Delta\lambda_{FSR}$, is given by:

$$\Delta\lambda_{FSR} = \frac{\lambda^2}{2(n_{GE}L_{GE} + n_W L_{EFF})} \quad (6)$$

where $n_{GE}$ is effective group refractive index of gain element 12, $L_{GE}$ is the length of gain element 12, $n_W$ is the effective group refractive index of waveguide 20, and $L_{EFF}$ is the effective length of the waveguide portion of the resonant cavity, shown in FIG. 1, and given by equation (1), which has been previously discussed.

For a typical gain element having a length, $L_{GE}$, of 500 μm, $n_{GE}$ of about 3.8, $n_W$ of about 1.5 and $L_{EFF}$ of about 1 mM, $\Delta\lambda_{FSP}$ will be about 0.35 nm and $\Delta T_{MODE-HOP}$ will be about 3.9° C. In order to avoid mode hops caused by temperature variations, it would be desirable to increase $\Delta T$ in equation (5) as much as possible by making $\Delta\lambda_{FSR}$ as large as possible. This would also accommodate for other wavelength drifts caused from gain element aging and mechanical creep of fiber alignment with gain element 10 occurring over time. Upon viewing the equation for $\Delta\lambda_{FSR}$, this suggests making the gain element length, $L_{GE}$, as short as practical. As an example, reducing the gain element to 100 μm length in combination with a shorter effective grating length of 500 μm yields a significant improvement in $\Delta T_{MODE-HOP}$ of about 12° C. Further advantages for combination short length gain element and effective grating length is that higher modulation rates can be achieved if the photon lifetime of the cavity is reduced as has been previously discussed.

Optimized stability against mode hopping can also be achieved through package assembly design of the waveguide DBR device to adjust longitudinal mode operation to be maintained in the center of the Bragg grating reflectivity band envelope 47. Reference is now made to FIG. 6 which illustrates a package design 50 comprising a high thermal conductivity submount 53 on which is disposed in aligned relation gain element 52 with optical waveguide 60 in the form of a single mode fiber. Gain element 52 has an active region 58 for providing stimulated emission which is reflected at HR coated rear facet 54 and exist through AR coated front facet 56 and is coupled into fiber 60 via coupling means 64. A short distance from coupling end of fiber 60, indicated by bare waveguide portion 66, is positioned a fiber grating 62 forming an optical resonant cavity between HR rear facet 54 and grating 62. In FIG. 6, fiber 60 is also mounted to submount 53 by means of base support 57 which may be comprised of, for example, Invar™, copper-tungsten or ceramic, which is not necessarily of high thermal conductivity material. Base support receives fiber support member 59 in cantilever fashion so that member 59 extends from along at least the length of grating 62 if not the effective length, $L_{EFF}$ of the external cavity portion comprising bare waveguide portion 66 and grating 62. In the design here, fiber support member 59 comprises a material of high thermal co-efficient of expansion, such as, for example, brass or copper, and submount 53 comparatively comprises lower thermal co-efficient of expansion wherein the distal lengths of change due to varying temperature are the length $L_B$ of high expansion material 59 and length $L_A$ of lower expansion material 53. If the thermal expansion of underlying submount 53 and fiber support member are chosen with values and lengths $L_A$ and $L_B$ so as to adjust the fiber 60 to become closer to gain element 52 at a rate that substantially nullifies the optical path length increase due to expansion of gain element due to rising operational temperature, then longitudinal mode alignment with respect to the Bragg reflectivity bandwidth of grating 62 will be satisfied and maintained. This is expressed mathematically by:

$$\left(\frac{\partial L_B}{\partial T} - \frac{\partial L_A}{\partial T}\right) = L_{GE}\left(\frac{\partial n_{GE}}{\partial T} - \frac{n_{GE}}{n_W}\frac{\partial n_W}{\partial T}\right) - \left(\frac{L_{GAP}}{n_W}\frac{\partial n_W}{\partial T}\right) \quad (7)$$

Another implementation of stabilization through a temperature compensated package is set forth in pending application Ser. No. 08/823,096, commonly assigned, entitled, "Fiber Grating Compensator for Preventing Laser Mode Hopping Caused by Thermal Fluctuations", which is incorporated herein by reference, a compensator attached in proximity to the fiber grating can suppress mode hopping caused by variations, in particular, increases in optical path length due to temperatures increases by reducing optical path length. Also, the compensator can be employed to stabilize wavelength by changing, such as reducing the period of the fiber grating with temperature increases, taking into the account the different rates of change with temperature of the grating period and of the optical path length.

FIG. 7 illustrates a standard approach for mode hop suppression through insuring temperature stabilization of waveguide DBR device 70. In FIG. 7, waveguide DBR device 70 comprises gain element 72 having an active region 78 for providing stimulated emission which is reflected at HR coated rear facet 74 and exists through AR coated front facet 76 for coupling into fiber 80 via optical coupling means 84. A short distance from the coupling end of fiber 80, indicated by bare waveguide portion 86, is fiber grating 82. Therefore, an optical resonant cavity is formed between HR rear facet 74 of gain element 72 and grating 82. Gain element 72 is supported on high thermal conductive submount 73 in aligned relation with fiber 80 which is supported on the same high thermal conductive submount by means of high thermal conductive support member 77. Submount 73 is, in turn, supported on temperature controlling element 75, e.g., a TEC cooler. Thus, all elements are heat sunk to the same support and maintained at same temperature to suppress mode hopping.

To minimize the chances of mode hopping during the lifetime of device 70, adjustment of the mode operating point can be achieved through temperature control of temperature controlling element 75 to maintain the temperature of device 70 between adjacent longitudinal modes of operation substantially midway of the reflectivity bandwidth of grating 82, as graphically illustrated in FIG. 9. This adjustment is accomplished by the steps of (1) determining the position of the mode hops along the power versus current operation curve, (2) choosing an operating temperature so that the laser operates within a window of operation between longitudinal mode hops within an intended range of current pumping of the gain element, and (3) continuously maintaining the selected operating temperature of the waveguide DBR device via temperature controlling element.

Thus, each fiber DBR laser package has a unique temperature and set point that aligns between adjacent longitudinal modes for optimum stability. This burden has a different physical basis compared to the requirement of DFB lasers to align their wavelengths to a WDM channel through temperature adjustment, but will be similar in implemental costs. In the fiber DBR lasers, channel alignment is essentially guaranteed by the precision of the fiber Bragg grating that results from the highly reproducible index of refraction of optical fibers and their low variation of index with temperature. If the mode hops of the fiber DBR laser are sufficiently far apart relative to temperature, then the variation of laser wavelength with temperature will be somewhat less for the fiber DBR laser than that observed for a DFB semiconductor laser. This is because a significant portion of the resonator is in the glass fiber has significantly lower refractive index temperature dependence. As a result, the fiber DBR laser has the potential for having a significantly more relaxed requirement of temperature stabilization than DFB semiconductor lasers for WDM applications.

Normally, there may also be some offset point chosen from a midway set point 94 in FIG. 9 to set the operating temperature for fiber DBR laser source 10 between mode hops taking into account device aging over time and resulting shift or creep in wavelength. Source 10 is set at a set point 94, which is approximately between or mid-way of the mode hops at the desired temperature of operation, to ensure that the initial beginning of life usage of the fiber DBR laser is at the point of maximum stability. Since laser modes tend to shift, up or down, in wavelength (indicated by arrow 95 in FIG. 9) with aging due to increased thermal loading that accompanies increased drive currents at constant power, changes in threshold carrier density, changes of in series resistance which changes thermal loading, etc., the initial operating point 94 may be chosen to not be precisely in the middle of the temperature window between mode hops, but rather, as shown in FIG. 9, can be offset, up or down, to compensate for any one of the above mentioned aging factors, which is illustrated here at set point 96, thereby extending the lifetime of the waveguide DBR device.

FIG. 8 illustrates an embodiment of this invention for achieving adjustment of optical path length 90 of the resonant cavity to adjust the wavelength of operation through optical length trimming of the laser resonant cavity so that the fiber DBR laser operates with a longitudinal mode maintained at an optimum set point between mode hops as illustrated in FIG. 9. Laser 10 of FIG. 1 is also shown in FIG. 8 so that like components carry the same numerical identification and the description of FIG. 1 is also applicable to FIG. 8. Fiber 20 contains a element photosensitive to ultraviolet (UV) light, such as a germanium doped silica fiber. A portion of fiber 20 is exposed to UV radiation. Sufficiently prolonged UV exposure causes the background refractive index in the germanium doped core of the fiber to gradually change, e.g., increase in refractive index. The cumulative change in the optical path is dependent upon the length of the exposed fiber and the saturated value of the photoinduced index change in the fiber. To maximize the index change, the fiber may be sensitized employing hydrogen loading as is known in the art. The index changes may be as much as 0.01 but are more typically between 0.001 and 0.01. This index trimming with UV light, shown at 92 in FIG. 8, effectively adjusts the optical path length between the tip lens 24 of fiber 20 and its grating 22 by a small amount so that fiber reflector 22 is also shifted with respect to propagating longitudinal modes.

It should be noted that the UV illumination 92 of fiber 20 may be just a portion of the fiber, such as bare or grating-free section 26, or may include the entire fiber section including grating section 22, or be applied solely to grating section 22. However, since the grating reflection band is intended to be at a precisely controlled wavelength, it would be advantageous to perform the trimming in grating-free region 26 between the interface of lens tip 24 and the beginning of grating 26. Such a refractive index trimming process is amenable to automation and high throughput for volume manufacturing and mode adjustment of fiber DBR laser 10. The UV exposure process has the advantage of being accurate, stable and highly controllable since the optical path length change can be increased by discreet small amounts simply by increasing the length of time and/or the intensity of the UV exposure to the fiber.

It should be noted that trimming via optical path length change of fiber 20 can also be accomplished by tapering fiber 20, such as by laser trimming, to change its physical characteristics in such as a way that it changes effective optical path length of the fiber. While fiber tapering and the use of a compensator, as explained previously do effectively work, UV trimming may be preferred because of its accuracy in adjusting precisely for desired optical path length change to fiber 20.

In a further aspect of this invention, trimming via optical path length change can also be accomplished with gain element 12 per se or in combination with changes to fiber 20 as explained above. In this connection, reference is made to FIG. 16 which shows a modified waveguide DBR laser 10' of the FIG. 1 embodiment wherein gain element 12 comprises a current pumping or modulation section 12A and a phase section 12B. These sections 12A, 12B can be independently addressed so that the majority of gain is achieved through pumping of section 12A, and section 12B is operated to the control the refractive index of this section to effectively adjust the cavity length, $L_{GE}$, of gain element 10 by change in its effective refractive index. This index control of phase section 12B may be accomplished with biasing by free-carrier injection via forward biasing the section, or by utilizing the Franz-Keldish effect via reverse biasing the section, or by direct temperature control through Joules heating through current injection, or through a local heating element deposited directly on phase section 12B or by employment of a local Peltier cooler.

Reference is now made to a low-cost approach for alignment and setting of a fiber DBR laser comprising this invention. Initial alignment of gain element 12 and fiber 20 with fiber grating 22 is carried out wherein optical coupling efficiency is initially maximized without any initial monitoring of laser spectral properties. Since the longitudinal mode alignment impacts the output coupling and cavity Q, monitoring coupling efficiency by maximizing laser output power can be deceiving approach. A more preferred approach is, therefore, to operate fiber DBR laser 10 below threshold and to maximize the coupling of the laser spontaneous emission into optical fiber 20. Once this coupling is accomplished, the laser is then operated at its intended operating output power. The operating temperature of the fiber DBR laser is varied across a temperature range to observe the laser mode hopping points with changing temperature, and to identify the two mode hops that bracket the most desirable operating temperature of the laser. This would typically be somewhere in the range of 15° C. to 30° C. The behavior of wavelength output with temperature is illustrated in FIG. 9, as previously discussed.

Alternatively, the above mentioned initial alignment between the gain element and the optical fiber can also be accomplished without a fiber grating and maximize the coupling of the laser spontaneous emission (below threshold) into optical fiber 20. Next, fiber grating 22 is formed into the fiber using conventional techniques and the fiber DBR laser operation is monitored as the grating is formed, such as via UV mask exposure, to select the set point of operation within the desired mode hop window of operation. This step can also be carried out in combination with UV exposure of grating-free section 26 per UV beam 94 to achieve desired set point operation.

It should be understood that in the practice of this invention that adjustment of the set point in FIG. 9 can also be further set alone relative to a fixed operating temperature or in combination with a selection of an operating temperature and optical path length change, as previously discussed. For example, after initial coupling of gain element 12 with fiber 20 and mode hop determination as discussed above, UV exposure may be employed for achieving optical path length change alone or with slight temperature variation to obtain a desire set point in FIG. 9. Also, as previously explained, fiber grating 22 may be held at the same temperature as gain element 12 as shown in FIG. 7. Also, as previously explained, a mode transformer can be formed at the exit end of the gain element to enhance and maintain high level optical coupling efficiency and alignment stability as shown in FIG. 16.

Reference is now made to FIGS. 10–12, which illustrate the successful performance of fiber DBR lasers of the type comprising this invention which show results that are as good as, if not better than, semiconductor DFB lasers. In FIG. 10, the L-I curve for a fiber DBR laser 10 illustrates achievement of 10 mW of output power without the occurrence of any mode hops. In operation of a source 10 of FIG. 1 in a standard 14-pin butterfly package, we have obtained kink-free operation with fiber output power up to 15 mW with threshold operation around 20 mA. FIG. 11 illustrates the fiber DBR wavelength spectrum demonstrating an about 40 dB side mode suppression ratio. FIG. 12 indicates that the linewidth output of the fiber DBR laser 10 is less than 300 kHz in single longitudinal mode, in particular, a narrow linewidth of about 100 kHz to about 260 kHz. In the frequency range of interest for digital applications, i.e. 20 MHz to 10 GHz, the laser RIN level was below −135 dB/Hz. The temperature sensitivity of the wavelength operation for three separate sources at 1553.3 nm, 1554.1 nm and 1554.9 nm (channel spacing of 0.8 nm or 100 GHz) is shown in FIG. 3, previously referred to relative to the description of FIG. 9. It can be seen that the sources mode hop about every 5° C. to 8° C. change in temperature due to different rates of thermally induced index change for gain element 12 and fiber 20. Between mode hops, the temperature sensitivity of approximately 0.2 Å/°C. depending on cavity configuration, as outlined in FIG. 1 with respect to cavity length portions, refractive index of the cavity portions and grating strength, i.e., reflectivity level.

Reference is now made to FIGS. 13A and 13B for purposes of illustrating particular applications of the waveguide DBR device of this invention. In FIG. 13A, fiber DBR laser 10 functions as a modulated transmitter such as operating at 1.5 $\mu$m, and is coupled to optical fiber amplifier 98, such as an $Er^+$ doped fiber capable of amplifying the 1.5 $\mu$m modulated signal. Pump source 93 is coupled via WDM device 97 to amplifier 98 having an absorption wavelength of 980 nm or 1480 nm to provide optical pumping and resulting in gain to amplify the modulated input signal from transmitter 10. A series of such transmitters 10 may be employed in dense WDM transmitter applications. As a specific example, the cavity length of gain element 12 of transmitter 10 is made relatively short so that most of the resonant cavity is basically with the optical fiber comprising $L_{EFF}$ (grating 22 and grating-free section 26). With reference to FIG. 1, the cavity length, $L_{GE}$ may be about 250 $\mu$m to 300 $\mu$m and $L_{EFF}$ may be about 1 mm. The shorted cavity length, principally from the gain element, and a short cavity length or reduction in cavity length form a compact cavity design in the manner in relation to formula (3) permitting fiber DBR lasers of this invention to achieve high modulation rates of operation such as 2.5 Gb/s. Since these fiber DBR lasers operate with low chirp, an expensive external modulator for data modulation is no longer required and the semiconductor gain element itself may be modulated to provide accurate high speed data modulation required for dense WDM systems, e.g., analog CATV.

FIG. 13B illustrates the same configuration as shown in FIG. 13A except pump source 93 is also configured as a fiber DBR laser operating cw at 980 nm or 1480 nm. There may be certain applications where pump source in the form of a waveguide DBR is highly desirable to insure high level wavelength stabilization of the pump source, such as needed when multiplexing several pump sources at slightly different wavelengths in order to scale the available pump power.

Reference is now made to FIG. 14 which illustrates a grating waveguide coupled laser utilizing a planar waveguide with an incorporated grating reflector rather than a fiber with an incorporated grating reflector as shown in FIG. 1. As compared to the fabrication of fiber DBR lasers, planar waveguide DBR laser 100 of FIG. 14 is of lower cost in fabrication with lower time required for alignment and capable of producing good wavelength stability. The coupling method illustrated is entirely passive utilizing silica-on-silicon technology. The passive alignment method relies on the silica-on-silicon platform where silicon etched alignment of matching grooves and ridges between a laser diode and or laser diode array and a silicon microbench provides for interlocking alignment as well as optical alignment of the diode output or outputs with a planar channel waveguide or multiple aligned waveguides.

Waveguide DBR laser 100 fundamentally operates in the same manner as fiber DBR laser 10 but comprises, instead, a silica waveguide 108 formed on a microbench 102 such as made of silicon. Silicon is a preferred material because it can selectively etched or trimmed to a precise shape and alignment as well as mass produced at the wafer level forming multiple microbenches with formed optical waveguides and their gratings. Silica waveguide 108 is formed on silicon microbench 102 by first forming a silica layer 112 of $SiO_2$ on microbench 102 followed by a second layer of $Ge:SiO_2$, so as to have a higher refractive index compared to first layer 112. Then, the second layer is selectively etched away via suitable masking to form waveguide 108. Next, a third layer 114 of $SiO_2$ is formed over the etched surface exposing layer 112 and waveguide 108, as shown in FIG. 14, forming a buried waveguide 108 having a higher refractive index than layers 112 and 114 surrounding the waveguide.

Bragg grating 110 is formed in waveguide 108 in the same manner as fiber gratings using UV mask exposure techniques as is known in the art. Multiple pitch ratings can be simultaneously written on a silica on silicon wafer employing phase-mask printing technology. This eliminates the successive sequential fabrication of gratings, and the costs associated with the stock management of different wavelength fibers. Literally hundreds of such waveguide parts can be fabricated at the same time on a single silicon wafer.

One end of silicon microbench 102 includes slot or groove 107 for aligned receipt of gain element 103 comprising a single stripe laser with pumping stripe 104 and emitter 105. Gain element 103 may be an unstrained or strained, multiple quantum well active region, InGaAs/GaAs or InGaAsP/InP laser diode with an AR coated front facet 103A and a HR rear facet 103B. The bottom portion 106 of element 103 comprises an extended portion for precision mating with groove 107 so that upon their securing together element 103 within groove 107, the beam from emitter 105 is accurately aligned in butt coupled fashion to input end 109 of waveguide 108. The lensing of the emitters can be accomplished by butt coupling or with the employment of a lens system as is well known in the art. Extended portion 106 may be an etched portion of the substrate of gain element 103, such as GaAs or InP, or may be a formed silicon or other element secured to the undersurface of the gain element substrate. Moreover, it is within the scope of this invention, that Group III-V gain element 103 is initially fabricated on a silicon substrate with appropriate interfacing, buffering and lattice compensation provided between the subsequent growths of the gain element Group III-V layers and silicon substrate.

Waveguide 108 may also be a surface channel or surface waveguide but a buried channel is preferred to obtain good waveguiding properties. Beside being made of silica, the portion comprising waveguide 108 on silicon microbench 102 may be a silicate glass substrate and a channel or embedded waveguide 108 is formed by means of an ion exchange process. Also, the portion making up layers 112, 114 may be comprised of a ferroelectric waveguide material, such as LiNbO$_3$, in which a proton exchange channel is formed quasi phase matching (QPM) to achieve frequency mixing. Moreover, the QPM domain regions may be formed employing electric field poling to provide a SHG frequency doubling device.

Thus, a lasing or resonant cavity is established between the HR rear facet 103B and grating 110 formed in silica waveguide 108, exit facet 103A being AR coated to below 1% reflectivity level so as not to be effectively involved in the operation of the established lasing cavity. Since the silica on silicon waveguide fabrication process is carried out by photolithography, the dimensional tolerances can be precision controlled forming one or more channel waveguides.

Reference is now made to FIG. 15 which shows an array of gain elements associated with a plurality of silica waveguides formed on a silicon microbench with their outputs coupled to from a power scaled output. Waveguide grating DBR laser 120 comprises laser diode array chip 122 having a plurality of spatial emitters 124 that are optically coupled to input ends of Ge doped silica waveguides 130 formed in the manner as previous explained in connection with FIG. 14. Array chip 122 is inserted in a slot 102B formed in silicon microbench 120A. The depth of slot 120B is formed relative to silica waveguide 130 so that the output of emitters 124 are coupled into the input end of waveguides 130. At the input ends of waveguides 130 are formed Bragg gratings 126 so that the individual emitters form lasing or resonant cavities between HR rear facet 121 of array 122 and gratings 126, the front facet 123 being AR coated. Each of the emitters 124 operate as a gain element which may be independently or as a group modulated to produce a modulated signal on its respective waveguide 130. The operational wavelength, $\lambda_1$–$\lambda_6$, of each individual emitter is slightly different, such as by a few tenths of a nm or more, so that they can be WDM combined through respective coupling regions 128A–128E that include a coupling grating. The coupling gratings in couplers 128A–128E are designed to coupled to different wavelengths of light traveling in adjacent waveguides 130 so as to be transparent to one of the wavelengths but sensitive to the other to cause transfer of its light to an adjacent channel waveguide for combining with the light propagating in the channel waveguide insensitive to the grating. Therefore, light $\lambda_2$ in waveguide 130A is combined via coupler 128A with light Ge doped $\lambda_2$ of waveguide 130B, light in waveguide 130B is combined via coupler 128B with light $\lambda_3$ in waveguide 130C and so on. The propagating light in waveguides 130 is thus coupled over to an adjacent waveguide 130 until all are coupled to form a single light output at waveguide 132. Gratings 126 and 128 are formed in the silica waveguides in the same manner as previously explained in connection with FIG. 14.

One important aspect of the laser 120 of FIG. 15 is that this structure provides a low cost operable approach compared to fiber DBR arrays which are more difficult to fabricate involving fiber lens centering of multiple fibers and the multiplicity of fiber coupling is not possible in a short as a dimension as is in the case of the silicon microbench which can be mass produced on a wafer scale. The step of lying down optical fibers in precision-made array ferrules or V-groove substrates for alignment is eliminated and no longer necessary as placement precision is guaranteed in the design of waveguide DBR laser 120.

Reference is again is made to mode hop suppression, already previously discussed, but in reference here to waveguide DBR lasers 100 and 120. Again, a problem with assembled planar waveguide grating DBR lasers or laser arrays is the occasional occurrence of longitudinal mode hopping. Mop hops occur when the current or temperature in the established resonant cavity cause the Fabry-Perot mode in the external cavity to fall beneath or outside of the DBR grating reflectivity bandwidth. This phenominum can occur cyclically about every 100 mA of current increase and about every 5° C. to 10° C. temperature change depending on design. Such power dips, as is known, in the power versus current curve of operation combined with the obvious spectral instability will render these sources unsuitable for use in data transmission. The exact position of the mode hop depends upon established cavity length. A $\lambda/2n$ variation in the cavity will cause a mode hop. UV laser trimming may be utilized to change the silica glass background index during final testing of laser 100 or 120 to control the effective cavity length and remove the occurrence of mode hops from the operation of the laser. This is accomplished by the steps of (1) determining the position of the mode hops along the power versus current operation curve, (2) choosing an operating temperature so that the laser operates within a window of operation between longitudinal mode hops within an intended range of current pumping of the gain element, and (3) trimming or fine tuning the waveguide index, such as with UV laser exposure, so that the wavelength of operation is positioned within the established between-mode hop window (FIG. 9) so that the laser operation remains mode hop free at the chosen operating temperature.

The planar waveguide DBR lasers 100 and 120 of FIGS. 14 and 15 permit the use of semiconductor gain elements of high gain but of short cavity length which, as explained previously, leads to the achievement of high speed data modulation of the gain element such as operation at 2.5 Gb/s, eliminating the need for an external modulator which are of additional added expense. Such a packaged laser device will provide a significant decrease in component costs for WDM transmitters and dense WDM transmitters.

While the discussion here as well as the pictorial representations of the inventive concepts herein have been directed to a waveguide DBR light emitting device in one form as a fiber DBR laser, it will be understood by those skilled in the art that the main features relating to the invention are applicable to gain elements having multiple emitters each optically coupled to an optical fiber with a respective reflector, such as a grating, forming a fiber DBR array. The gratings may have a reflection bandwidth substantially all at the same wavelength or can be of different wavelengths for WDM combining in a dense WDM transmission system.

Although the invention has been described in conjunction with one or more preferred embodiments, it will be apparent to those skilled in the art that other alternatives, variations and modifications will be apparent in light of the foregoing description as being within the spirit and scope of the invention. Thus, the invention described herein is intended to embrace all such alternatives, variations and modifications as may fall within the spirit and scope of the following claims.

What is claimed is:

1. A waveguide DBR light emitting device comprising:
   a semiconductor gain element having a rear reflecting facet and a substantially nonreflecting exit facet;
   an optical waveguide having an input end optically coupled to said gain element via said exit facet;
   reflection means associated with said optical waveguide to provide feedback to said gain element; and
   means to adjust said reflection means to provide operation freedom of the device from longitudinal mode hopping.

2. The waveguide DBR light emitting device of claim 1 wherein said reflection means comprises a DBR grating.

3. The waveguide DBR light emitting device of claim 1 further comprising means for modulating said device at a modulation rate in excess of 200 Mb/s.

4. The waveguide DBR light emitting device of claim 1 wherein said optical waveguide is a fiber and said reflection means is a fiber Bragg grating.

5. The waveguide DBR light emitting device of claim 1 wherein said optical waveguide is a planar waveguide and said reflection means is a Bragg grating formed in said waveguide.

6. The waveguide DBR light emitting device of claim 1 wherein any residual reflectivity from said exit facet back into said gain element is less than 1%.

7. The waveguide DBR light emitting device of claim 1 wherein said reflection means is an apodized grating.

8. The waveguide DBR light emitting device of claim 1 wherein said reflection means is a chirped grating.

9. The waveguide DBR light emitting device of claim 8 wherein said chirped grating has a smaller period at a grating end furthermost from said exit facet.

10. The waveguide DBR light emitting device of claim 8 wherein chirp for said chirped grating is chosen so as to increase the modulation bandwidth of said device.

11. The waveguide DBR light emitting device of claim 1 wherein said optical waveguide is silica formed on a substrate.

12. The waveguide DBR light emitting device of claim 11 wherein said substrate is silicon.

13. The waveguide DBR light emitting device of claim 1 wherein said optical waveguide is an optical fiber.

14. The waveguide DBR light emitting device of claim 13 wherein said optical coupling comprises a lens formed on an input end of said optical fiber.

15. The waveguide DBR light emitting device of claim 14 wherein said lens is a conical shaped lens or a chisel shaped lens.

16. The waveguide DBR light emitting device of claim 1 further comprising an optical fiber constituting said optical waveguide, stabilization means affecting one or both of said reflection means and said fiber to adjust the wavelength operation of the device to stabilize wavelength operation of the device between adjacently competing longitudinal modes of operation at a given operating temperature.

17. The waveguide DBR light emitting device of claim 16 wherein the adjustment of said wavelength operation is within 2 nm.

18. The waveguide DBR light emitting device of claim 16 wherein said stabilization means comprises means to microstretch said optical fiber including said reflection means.

19. The waveguide DBR light emitting device of claim 18 wherein said microstretch applied said optical fiber is about 1% of an original length of said fiber.

20. The waveguide DBR light emitting device of claim 16 wherein said stabilization means comprises exposing ultraviolet light on said reflection means.

21. The waveguide DBR light emitting device of claim 1 wherein said gain element includes a pumping stripe.

22. The waveguide DBR light emitting device of claim 21 wherein said pumping stripe has a curve in said stripe adjacent to said exit facet so that a curved portion between said curve and said exit facet is disposed at an angle less than 90° relative to a planar extent of said exit facet.

23. The waveguide DBR light emitting device of claim 22 wherein said curved portion is at an angle of about 5° to about 15° from the normal to said exit facet planar extent.

24. The waveguide DBR light emitting device of claim 1 wherein said rear facet and said grating form a resonant cavity, said reflection means and cavity length selected to produce mode locked operation of the device.

25. A waveguide DBR light emitting device comprising:
   a semiconductor gain element having a rear reflecting facet and a substantially nonreflecting exit facet;
   an optical waveguide having an input end optically coupled to said gain element via said exit facet;
   a grating having a grating period associated with said optical waveguide to provide feedback to said gain element; and
   means to adjust the refractive index of said gain element to provide operation freedom of the device from longitudinal mode hopping.

26. The waveguide DBR light emitting device of claim 25 wherein said gain element has at least one contact region, said adjusting means comprising current pumping of at least one of said regions to change the refractive index of at least a portion of said gain element.

27. The waveguide DBR light emitting device of claim 25 wherein said adjusting means comprises a TEC cooler or heater in thermal communication with said gain element.

28. A waveguide DBR light emitting device comprising:
   a semiconductor gain element having a reflecting rear facet and a substantially antireflecting exit facet;
   at least two electrical contacts formed on a surface of said gain element;
   means to adjust the current supplied to said contacts independently of one another;
   an optical waveguide having an input end optically coupled to said gain element via said exit facet;
   reflection means associated with said optical waveguide to provide feedback to said gain element.

29. The waveguide DBR light emitting device of claim 28 wherein said reflection means comprises a DBR grating.

30. The waveguide DBR light emitting device of claim 28 further comprising means for modulating at least one of said contacts at a modulation rate in excess of 200 Mb/s.

31. The waveguide DBR light emitting device of claim 28 wherein current supplied to at least one of said contacts is adjusted to change effective refractive index of said gain element by free carrier injection or reverse biasing.

32. A waveguide DBR light emitting device for single wavelength, high speed modulated operation comprising:
   a semiconductor gain element having a reflecting rear facet and a substantially antireflecting exit facet;
   an optical waveguide having an input end optically coupled to said gain element via said exit facet;
   a waveguide grating formed in said optical waveguide in close proximity to said exit facet forming a resonant cavity between said gain element rear facet, lengths of said resonant cavity, gain element and waveguide grating chosen to satisfy the relationship of:

$$\left( \frac{L_{BW} + \frac{\tanh(\kappa L_G)}{2\kappa}}{L_{GE}} \right) < \left[ \left( \frac{\nu_{GE}}{\nu_{DBR}} \right)^2 - 1 \right] \frac{n_{GE}}{n_W}$$

where $L_{BW}$ is the length of optical bare waveguide between the antireflecting exit facet and the waveguide grating, $L_G$ is the length of the waveguide grating, $L_{GE}$ is the length of the gain element, K is the coupling constant of the waveguide grating, $\nu_{GE}$ is the relaxation oscillation frequency of the gain element, $\nu_{DBR}$ is the relaxation oscillation frequency of the resonant cavity, $n_{GE}$ is the effective refractive index of the gain element, and $n_W$ is the effective refractive index of the optical waveguide.

33. The waveguide DBR light emitting device of claim 32 wherein said device is modulated in excess of 2 Gb/sec.

34. The waveguide DBR light emitting device of claim 32 wherein said optical waveguide is a fiber and said waveguide grating is fiber Bragg grating.

35. The waveguide DBR light emitting device of claim 32 wherein said optical waveguide is a planar waveguide and said waveguide grating is a Bragg grating formed in said waveguide.

36. The waveguide DBR light emitting device of claim 32 wherein any residual reflectivity from said exit facet back into said gain element is less than 1%.

37. The waveguide DBR light emitting device of claim 32 wherein said grating is an apodized grating.

38. The waveguide DBR light emitting device of claim 32 wherein said grating is a chirped grating.

39. The waveguide DBR light emitting device of claim 38 wherein said chirped grating has a smaller period at a grating end furthermost from said exit facet.

40. The waveguide DBR light emitting device of claim 38 wherein chirp for said chirped grating is chosen so as to increase the modulation bandwidth of said device.

41. The waveguide DBR light emitting device of claim 32 wherein said optical waveguide is silica formed on a substrate.

42. The waveguide DBR light emitting device of claim 41 wherein said substrate is silicon.

43. The waveguide DBR light emitting device of claim 32 wherein said optical waveguide is an optical fiber.

44. The waveguide DBR light emitting device of claim 43 wherein said optical coupling comprises a lens formed on an input end of said optical fiber.

45. The waveguide DBR light emitting device of claim 44 wherein said lens is a conical shaped lens or a chisel shaped lens.

46. The waveguide DBR light emitting device of claim 32 further comprising an optical fiber constituting said optical waveguide, stabilization means affecting one or both of said reflection means and said fiber to adjust the wavelength operation of the device to stabilize wavelength operation of the device between adjacently competing longitudinal modes of operation at a given operating temperature.

47. The waveguide DBR light emitting device of claim 46 wherein the adjustment of said wavelength operation is within 2 nm.

48. The waveguide DBR light emitting device of claim 46 wherein said stabilization means comprises means to microstretch said optical fiber including said grating.

49. The waveguide DBR light emitting device of claim 46 wherein said microstretch applied said optical fiber is about 1% of an original length of said fiber.

50. The waveguide DBR light emitting device of claim 46 wherein said stabilization means comprises exposing ultraviolet light on said grating.

51. The waveguide DBR light emitting device of claim 32 wherein said gain element includes a pumping stripe.

52. The waveguide DBR light emitting device of claim 51 wherein said pumping stripe has a curve in said stripe adjacent to said exit facet so that a curved portion between said curve and said exit facet is disposed at an angle less than 90° relative to a planar extent of said exit facet.

53. The waveguide DBR light emitting device of claim 52 wherein said curved portion is at an angle of about 5° to about 15° from the normal to said exit facet planar extent.

54. The waveguide DBR light emitting device of claim 51 wherein said pumping stripe includes a stripe portion adjacent to said exit facet disposed at an angle less than 90° relative to a planar extent of said exit facet.

55. The waveguide DBR light emitting device of claim 54 wherein said curved portion is at an angle of 5° to about 15° from the normal to said exit facet planar extent.

56. The waveguide DBR light emitting device of claim 51 wherein at least a portion of said pumping stripe has a tapered section.

57. The waveguide DBR light emitting device of claim 32 wherein said optical waveguide is polarization maintaining medium.

58. A waveguide DBR laser device comprising:
   a semiconductor gain element having a reflecting rear facet and a substantially antireflecting exit facet;
   an optical waveguide having an input end optically coupled to said gain element via said exit facet;
   a waveguide grating having a predetermined grating period formed in said optical waveguide in close proximity to said exit facet forming a resonant cavity between said rear facet and said grating; and
   means to vary the period of said grating to stabilize wavelength operation of the device between adjacently competing longitudinal modes of operation at a given operating temperature.

59. The semiconductor laser device of claim 58 wherein any residual reflectivity from said exit facet back into said gain element is less than 1%.

60. The waveguide DBR laser device of claim 58 wherein said optical waveguide is polarization maintaining medium.

61. The waveguide DBR laser device of claim 58 wherein said waveguide grating is apodized.

62. The waveguide DBR laser device of claim 58 wherein said waveguide grating is chirped.

63. A waveguide DBR laser device comprising:
   a semiconductor gain element having a reflecting rear facet and a substantially antireflecting exit facet;
   an optical waveguide having an input end optically coupled to said gain element via said exit facet;
   a waveguide grating having a predetermined grating period formed in said optical waveguide in close proximity to said exit facet forming a resonant cavity between said rear facet and said grating; and
   means to vary the path length of said optical waveguide to stabilize the operation of said laser device between adjacent longitudinal modes of operation.

64. The waveguide DBR laser device of claim 63 wherein said varying means changes the refractive index of said optical waveguide.

65. The waveguide DBR laser device of claim 63 wherein said refractive index change is effected by application of UV radiation to at least a portion of said optical waveguide.

66. The waveguide DBR laser device of claim 63 wherein said waveguide grating is a part of the path length of said optical waveguide that is varied.

67. The waveguide DBR laser device of claim 66 wherein said varying means changes the refractive index of said waveguide grating.

68. The waveguide DBR laser device of claim 63 wherein any residual reflectivity from said exit facet back into said gain element is less than 1%.

69. The waveguide DBR laser device of claim 63 wherein said optical waveguide is polarization maintaining medium.

70. The waveguide DBR laser device of claim 63 wherein said waveguide grating is apodized.

71. The waveguide DBR laser device of claim 63 wherein said waveguide grating is chirped.

72. A waveguide DBR laser device for single longitudinal mode, high speed operation comprising:

a semiconductor gain element having a reflecting rear facet and a substantially antireflecting exit facet;

an optical waveguide having an input end optically coupled to said gain element via said exit facet;

a waveguide grating having a predetermined grating period formed in said optical waveguide in close proximity to said exit facet forming a resonant cavity between said rear facet and said grating;

wherein the ratio of the effective length of said waveguide to the length of said gain element is adjusted to maximize the achievable modulation rate of said gain element.

73. The waveguide DBR laser device of claim 72 wherein said effective waveguide length does not exceed about 20 times the length of said gain element.

74. The waveguide DBR laser device of claim 72 wherein any residual reflectivity from said exit facet back into said gain element is less than 1%.

75. The waveguide DBR laser device of claim 72 wherein said optical waveguide is polarization maintaining medium.

76. The waveguide DBR laser device of claim 72 wherein said waveguide grating is apodized.

77. The waveguide DBR laser device of claim 72 wherein said waveguide grating is chirped.

78. A waveguide DBR laser device for single longitudinal mode, high speed operation for modulation in excess of 2 Gb/sec comprising:

a semiconductor gain element having a high reflecting rear facet and antireflecting exit facet;

an optical waveguide having an input end optically coupled to said gain element via said exit facet;

a waveguide grating having a predetermined grating period formed in said optical waveguide in close proximity to said input end forming a resonant cavity between said rear facet and said grating; and stabilization means to prevent longitudinal mode hopping between longitudinal modes of operation in said resonant cavity.

79. The waveguide DBR laser device of claim 78 wherein said stabilization means comprises temperature varying means applied to said grating.

80. The waveguide DBR laser device of claim 78 wherein said stabilization means comprises temperature varying means applied to said gain element.

81. The waveguide DBR laser device of claim 80 wherein said temperature varying means comprises means for adjusting applied current to at least a portion of said gain element.

82. The waveguide DBR laser device of claim 80 wherein said temperature varying means comprises a thermoelectric cooler or a heater applied at least to said gain element.

83. The waveguide DBR laser device of claim 80 wherein said stabilization means comprises the application of ultraviolet radiation to said grating.

84. The waveguide DBR laser device of claim 80 wherein said stabilization means comprises means to apply compressional or tensional strain to said grating.

85. The waveguide DBR laser device of claim 80 further comprising a pumping stripe formed in said gain element, a portion of said pumping stripe adjacent to said antireflecting exit facet oriented at an angle of 5° to about 15° from a position normal to a planar extent of said antireflecting exit facet.

86. The waveguide DBR laser device of claim 80 wherein any residual reflectivity from said exit facet back into said gain element is less than 1%.

87. The waveguide DBR laser device of claim 80 wherein said optical waveguide is polarization maintaining medium.

88. The waveguide DBR laser device of claim 80 wherein said waveguide grating is apodized.

89. The waveguide DBR laser device of claim 80 wherein said waveguide grating is chirped.

90. A waveguide DBR laser device for single longitudinal mode, high speed operation for modulation in excess of 2 Gb/sec comprising:

a semiconductor gain element having a high reflecting rear facet and antireflecting exit facet;

an optical waveguide having an input end optically coupled to said gain element via said exit facet;

a waveguide grating having a grating period formed in said optical waveguide in close proximity to said exit facet forming a resonant cavity between said rear facet and said grating; and adjustment means to maintain lasing operation within said resonant cavity between adjacent longitudinal modes of operation.

91. The waveguide DBR light emitting device of claim 90 wherein said stabilization means comprises exposing ultraviolet light on either or both said optical waveguide and said reflection means or applying tension or compression on said reflection means.

92. The waveguide DBR light emitting device of claim 91 wherein said optical waveguide is an optical fiber and said reflection means is a fiber Bragg grating.

93. The waveguide DBR laser device of claim 92 wherein any residual reflectivity from said exit facet back into said gain element is less than 1%.

94. The waveguide DBR laser device of claim 92 wherein said waveguide grating is apodized.

95. The waveguide DBR laser device of claim 92 wherein said waveguide grating is chirped.

96. A waveguide DBR laser device comprising:

at least one semiconductor gain element having a reflecting rear facet and a substantially antireflecting exit facet with a plurality of emitters each capable of single longitudinal mode, high speed operation for modulation in excess of 2 Gb/sec;

a plurality of optical waveguides each having an input end optically coupled to a respective emitter of said gain element via said exit facet;

waveguide grating having a grating period formed in each of said optical waveguide in close proximity to said exit facet forming a plurality of resonant cavities between said rear facet and said respective gratings;

each of said grating periods set such that each of the resonant cavities operate at a different wavelength;

stabilization means to prevent longitudinal mode hopping in the resonant cavities between longitudinal modes;

means to independently modulate at least some of said gain elements providing a modulated signal representative of information; and WDM means for combining individual outputs of said resonant cavities forming a single output of multiple modulated signals.

97. The waveguide DBR laser device of claim 96 wherein any residual reflectivity from said exit facet back into said gain element is less than 1%.

98. The waveguide DBR laser device of claim 97 wherein said waveguide grating is apodized.

99. The waveguide DBR laser device of claim 97 wherein said waveguide grating is chirped.

100. A method of operating a waveguide DBR laser device to achieve stable single longitudinal mode operation wherein the device includes a gain element having exit output and rear facets with radiation from the exit output facet coupled to an external cavity comprising an optical waveguide and a grating having a predetermined grating period formed in said waveguide to form a resonator cavity between the rear facet of the gain element and the waveguide grating, the method comprising the steps of:

coating the exit output facet with an antireflecting coating so that any residual established Fabry-Perot modes are substantially eliminated;

operating the laser device at a given temperature and effecting a change in the waveguide grating operating wavelength so that the gain element resonator cavity is forced to lase at a wavelength between adjacently competing longitudinal modes of operation at said given temperature.

101. The method of claim 100 wherein said wavelength change is less than 1 nm.

102. The method of claim 100 further comprising the step of incorporating a chirped grating in said waveguide grating to achieve single longitudinal mode stabilized operation.

103. A method of operating a waveguide DBR laser device to achieve stable single longitudinal mode operation wherein the device includes a gain element having exit output and rear facets with radiation from the exit output facet coupled to an external cavity comprising an optical waveguide and a grating having a predetermined grating period formed in said waveguide to form a resonator cavity between the rear facet of the gain element and the waveguide grating capable of mode hopping between longitudinal modes of operation, the method comprising the steps of:

determining positions of longitudinal mode hops in operation of the device over a range of applied current;

choosing an operating temperature for the device so that it operates within a window of operation between determined longitudinal mode hops within an intended range of current operation of the device; and trimming the refractive index of the optical waveguide so that the wavelength behavior of the laser remains within the window.

104. The method of claim 103 including the further step of maintaining the operating temperature by controlled heating.

105. The method of claim 103 wherein the refractive index trimming of the optical waveguide is accomplished by exposing the optical waveguide to UV light.

106. The method of claim 105 including the further step of maintaining the operating temperature by controlled heating.

107. The method of claim 103 wherein the step of refractive index trimming of the optical waveguide includes the waveguide grating.

108. The method of claim 107 wherein the refractive index trimming of the optical waveguide is accomplished by exposing the optical waveguide to UV light.

109. A method of operating a waveguide DBR laser device to achieve stable single longitudinal mode operation wherein the device includes a gain element having exit output and rear facets with radiation from the exit output facet coupled to an external cavity comprising an optical waveguide and a grating having a predetermined grating period formed in said waveguide to form a resonator cavity between the rear facet of the gain element and the waveguide grating capable of mode hopping between longitudinal modes of operation, the method comprising the steps of:

operating the waveguide DBR laser device below its lasing threshold of operation maximizing the coupling of laser spontaneous emission into the optical waveguide;

determining positions of longitudinal mode hops in operation of the device over a range of applied current; and choosing an operating temperature for the device so that it operates within a window of operation between determined longitudinal mode hops within an intended range of current operation of the device.

110. The method of claim 109 comprising the further step of trimming the refractive index of the optical waveguide so that the wavelength behavior of the laser remains within the window.

111. The method of claim 109 including the further step of maintaining the operating temperature by controlled heating.

* * * * *